(12) United States Patent
French et al.

(10) Patent No.: US 7,438,995 B2
(45) Date of Patent: *Oct. 21, 2008

(54) USE OF PARTIALLY FLUORINATED POLYMERS IN APPLICATIONS REQUIRING TRANSPARENCY IN THE ULTRAVIOLET AND VACUUM ULTRAVIOLET

(75) Inventors: Roger Harquail French, Wilmington, DE (US); Robert Clayton Wheland, Wilmington, DE (US); Weiming Qiu, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 1023 days.

This patent is subject to a terminal disclaimer.

(21) Appl. No.: 10/475,245

(22) PCT Filed: May 14, 2002

(86) PCT No.: PCT/US02/18392

§ 371 (c)(1),
(2), (4) Date: Oct. 16, 2003

(87) PCT Pub. No.: WO02/093261

PCT Pub. Date: Nov. 21, 2002

(65) Prior Publication Data

US 2004/0142286 A1 Jul. 22, 2004

(51) Int. Cl.
*G03F 7/20* (2006.01)
*C08F 12/20* (2006.01)
*C08F 14/18* (2006.01)
*C08F 114/18* (2006.01)

(52) U.S. Cl. ............................ 430/5; 526/242; 526/247; 526/250; 526/255; 526/266; 526/270; 355/18; 355/77

(58) Field of Classification Search .............. 430/270.1, 430/5; 526/242, 247, 250, 253, 255, 270, 526/266

See application file for complete search history.

(56) References Cited

U.S. PATENT DOCUMENTS

| 7,129,009 B2 * | 10/2006 | French et al. .................. 430/5 |
| 2001/0024701 A1 | 9/2001 | Matsukura et al. |
| 2002/0065383 A1 * | 5/2002 | McCone et al. ............. 526/247 |

FOREIGN PATENT DOCUMENTS

| EP | 0416517 | 3/1991 |
| EP | 0416528 | 3/1991 |
| JP | 59048766 | 3/1984 |
| JP | 01241557 | 9/1989 |
| JP | 07295207 | 11/1995 |
| WO | WO 98/22851 | 5/1998 |
| WO | WO 98/36324 | 8/1998 |
| WO | WO 01/37043 | 5/2001 |
| WO | WO 01/37044 | 5/2001 |

OTHER PUBLICATIONS

V. N. Vasilets, I. Hirata, H. Iwata and Y. Ikada, Photolysis of a Fluorinated Polymer Film by Vacuum Ultrviolet Radiation, Journal of Polymer Science: Part A: Polymer Chemistry, vol. 36, 2215-2222, (1998).

L. F. Thompson, C. G. Wilson, and M. J. Bowden, Introduction to Microlithography, Second Edition, American Chemical Society, Washington, DC 1994.

International Search Report for PCT/US02/18392 dated Oct. 1, 2002.

* cited by examiner

*Primary Examiner*—Cynthia H. Kelly
*Assistant Examiner*—Anca Eoff

(57) ABSTRACT

Disclosed are partially fluorinated and fully fluorinated polymers that are substantially transparent to ultraviolet radiation at wavelengths from approximately 150 nanometer to 260 nanometers.

31 Claims, 6 Drawing Sheets

USE OF PARTIALLY FLUORINATED POLYMERS IN APPLICATIONS REQUIRING TRANSPARENCY IN THE ULTRAVIOLET AND VACUUM ULTRAVIOLET

FIELD OF THE INVENTION

The present invention provides methods and associated apparatus for transmission of light in the range of 150 to 260 nanometers (nm), especially at 157 nm, 193 nm, and 248 nm, utilizing partially fluorinated polymers exhibiting high transparency.

TECHNICAL BACKGROUND OF THE INVENTION

The semiconductor industry is the foundation of the trillion dollar electronics industry. The semiconductor industry continues to meet the demands of Moore's law, whereby integrated circuit density doubles every 18 months, in large part because of continuous improvement of optical lithography's ability to print smaller features on silicon. This in turn depends in part upon identifying materials which exhibit sufficient transparency for practical use at ever-shorter wavelengths. For example, in photolithography, a circuit pattern is represented in a photomask, and an optical stepper is used to project the mask pattern onto a photoresist layer on a silicon wafer. Currently commercial scale photolithography is done at 248 nm. Lithography at 193 nm light is just entering early production. Current developmental efforts are directed to photolithography at 157 nm. A general discussion of photolithographic methods in electronics and related applications may be found in L. F. Thompson, C. G. Wilson, and M. J. Bowden, editors, Introduction to Microlithography, Second Edition, American Chemical Society, Washington, D.C. 1994

Polymers play a critical role in lithography in multiple area: one is the polymer pellicle which is placed over the mask pattern to keep any particulate contaminants out of the photomask object plane, thereby ensuring that the lithographic imaging will be defect free. The pellicle is a free standing polymer membrane, typically 0.8 micrometers in thickness, which is mounted on a typically 5 inch square frame. The pellicle film must have high transparency or transmission of light at the lithographic wavelength for efficient image formation and must neither darken nor burst with prolonged illumination in the optical stepper. Typical commercial processes utilize pellicles with >99% transmission through exploitation of polymers with very low optical absorption combined with thin film interference effects. The electronic industry requires greater than 98% transparency over an exposure lifetime of 75 million laser pulses of 0.1 mJ/cm$^2$, or a radiation dose of 7.5 kJ/cm$^2$.

A pellicle transmission of 98% corresponds to an absorbance A of approximately 0.01 per micrometer of film thickness. The absorbance is defined in Equation 1, where the Absorbance A in units of inverse micrometers ($\mu m^{-1}$) is defined as the base 10 logarithm of the ratio of the substrate transmission, $T_{substrate}$, divided by the transmission of the sample, consisting of the polymer film sample on the substrate, $T_{sample}$, divided by the polymer film thickness, t, in micrometers.

$$A_{film}(\mu m^{-1}) = A/um = \frac{Log_{10}[T_{substrate}/T_{sample}]}{t_{film}}. \quad \text{Equation 1}$$

Certain perfluoropolymers have been identified in the art as useful for optical applications such as light guides, anti-reflective coatings and layers, pellicles, and glues mostly at wavelengths above 200 nm WO 9836324, Aug. 20, 1998, Mitsui Chemical Inc., discloses the use of perfluorinated polymers, optionally in combination with silicone polymers having siloxane backbones, as pellicle membranes having an absorbance/micrometer of 0.1 to 1.0 at UV wavelengths from 140 to 200 nm.

WO 9822851, May 28, 1998, Mitsui Chemicals, Inc., claims the use at 248 nm of low molecular weight photodegradation-resistant, polymeric adhesives consisting largely of —($CF_2$-CXR) copolymers in which X is halogen and R is —Cl or —$CF_3$. Higher molecular weight polymers such as poly(perfluorobutenyl vinyl ether), poly[(tetrafluoroethylene/perfluoro-(2,2-dimethyl-1,3-dioxole)], poly(tetrafluoroethylene/hexafluoropropylene/vinylidene fluoride), poly(hexafluoropropylene/vinylidene fluoride), or poly(chlorotolyl fluorethylene/vinylidene fluoride) are disclosed as minor components to improve creep resistance. Only poly(chlorotrifluoroethylene) was exemplified.

Japanese Patent 07295207, Nov. 10, 1995, Shinetsu Chem. Ind Co, claims double layer pellicles combining Cytop CTXS (poly($CF_2$=$CFOCF_2CF_2CF$=$CF_2$)) with Teflon® AF 1600 for greater strength.

U.S. Pat. No. 5,286,567, Feb.. 15, 1994, Shin-Etsu Chemical Co., Ltd., claims the use of copolymers of tetrafluoroethylene and five membered cyclic perfluoroether monomers as pellicles once they have been made hydrophilic, and therefore antistatic, by plasma treatment.

European Patent 416528, Mar. 13, 1991, DuPont, claims amorphous fluoropolymers having a refractive index of 1.24-1.41 as pellicles at wavelengths of 190-820 nm. Copolymers of perfluoro(2,2-dimethyl-1,3-dioxole) with tetrafluoroethylene, chlorotrifluoroethylene, vinylidene fluoride, hexafluoropropylene, trifluoroethylene, vinyl fluoride, (perfluoroalkyl) ethylenes, and perfluoro(alkyl vinyl ethers) are cited.

Japanese Patent 01241557, Bando Chemical Industries, Ltd., Sep. 26, 1989, claims pellicles usable at 280-360 nm using (co)polymers of vinylidene fluoride ($VF_2$), tetrafluoroethylene/hexafluoropropylene (TFE/HFP), ethylene/tetrafluoroethylene (E/TFE), TFE/$CF_2$=CFORf, TFE/HFP/$CF_2$=CFORf, chlorotrifluoroethylene (CTFE), E/CTFE, CTFE,$VF_2$ and vinyl fluoride (VF).

Japanese Patent 59048766, Mar. 21, 1984, Mitsui Toatsu Chemicals, Inc., claims the use of a stretched film of poly (vinylidene fluoride) as having good transparency from 200 to 400 nm.

French et al, WO0137044, discloses vacuum ultraviolet (VUV) transparent materials exhibiting an absorbance/micron (A/micrometer) $\leq 1$ at wavelengths from 140-186 nm comprising amorphous vinyl homopolymers of perfluoro-2, 2-dimethyl-1,3-dioxole or $CX_2$=$CY_2$, where X is —F or —$CF_3$ and Y is H, or amorphous vinyl copolymers of perfluoro-2,2-dimethyl-1,3-dioxole and $CX_2$=$CY_2$.

French et al, WO0137043 discloses ultraviolet transparent materials exhibiting an absorbance/micron (A/micrometer) $\leq 1$ at wavelengths from 187-260 nm comprising amorphous vinyl copolymers of $CX_2$=$CY_2$, wherein X is —F or —$CF_3$ and Y is H and 0 to 25 mole % of one or more monomers CRaRb=CRcRd in the case where the CRaRb=CRcRd enters the copolymer in approximately alternating fashion, or 40 to 60 mole % of one or more monomers CRaRb=CrcRd in the case where the CRaRb=CrcRd enters the copolymer in approximately alternating fashion where each of Ra, Rb, and Rc is selected independently from H or F and Rd is selected from the group consisting of —F, —$CF_3$, —ORf where Rf is $CnF_{2n+1}$ with n=1 to 3, —OH (when Rc=H), and Cl (when Ra, Rb, and Rc=F).

Japanese Patent Application Kokai Number P2000-305255A Shin-Etsu Chemical Company discloses copolymers containing >70% perfluorodimethyldioxole and 0-30 mole % tetrafluoroethylene, trifluoroethylene, difluoroethylene, vinylidene fluoride, and hexafluoropropylene for use as pellicles at 158 nm.

Japanese Patent Publication P2000-338650AShin-Etsu Chemical Company discloses copolymers containing >20% of perfluoroalkoxy substituted dioxoles such as 2,2,4-trifluoro-5-trifluoromethoxy-1,3-dioxole with F-containing radically polymerizing monomers such as tetrafluoroethylene, trifluoroethylene, difluoroethylene, vinylidene fluoride, and hexafluoropropylene for use as pellicles at 157 nm.

U.S. patent publication 20010024701 from Asahi Glass Company discloses fluorine containing polymers having a polymer chain consisting of carbon atoms wherein some chain carbons are substituted with fluorine and unspecified fluorine-containing groups. Encompassed in the disclosure are numerous polymers which are unsuitable in practice for use in applications at 157 nm because they are strongly absorbing or highly crystalline with concomitant high light scattering. Pellicles are inoperable without reasonably high transparency and yet the claims as written could include 100% opaque materials and fails to teach any method by which highly useful and completely useless polymer candidates for such applications can be distinguished from one another.

Many of the fluoropolymers cited in the references above are noticeably hazy to the eye because of crystallinity and are therefore unsuitable for applications requiring high light transmission and the projection of precision circuit patterns. Poly(vinylidene fluoride), poly(chlorotrifluoroethylene), poly(tetrafluoroethylene/ethylene), commercially available poly(tetrafluoroethylene/hexafluoropropylene) compositions, and poly(ethylene/chlorotrifluoroethylene) are all such crystalline, optically hazy materials. More recent references have thus been directed at amorphous perfluoropolymers such as Cytop® and Teflon® AF because they combine outstanding optical clarity down to at least 193 nm, solubility, and a complete lack of crystallinity.

Absorption maxima for selected hydrocarbon and fluorocarbon compounds are shown in Table 1. For hydrocarbons $H(CH_2)_nH$ the data for n=1-8 is cited in B. A. Lombos et al Chem. Phys. Lett., 1967, 42. For fluorocarbons F(CF2)nF the n=3-6 data is cited in G. Belanger et. al., Chem. Phys. Letters, 3, 649(1969) while the datum for n=172 is cited in K. Sekl et al, Phys. Scripta, 41, 167(1990).

TABLE 1

Comparison of UV Absorption Maxima for Hydrocarbons and Fluorocarbons

| | WAVELENGTH OF ABSORPTION MAXIMUM | |
|---|---|---|
| | $C_nH_{2n+2}$ | $C_nF_{2n+2}$ |
| n = 1 | 143 nm & 128 nm | |
| n = 2 | 158 nm & 132 nm | |
| n = 3 | 159 nm & 140 nm | 119 nm |
| n = 4 | 160 nm & 141 nm | 126 nm |
| n = 5 | 161 nm & 142 nm | 135 nm |
| n = 6 | 162 nm & 143 nm | 142 nm |
| n = 7 | 163 nm & 143 nm | |
| n = 8 | 163 nm & 142 nm | |
| n = 172 | | 161 nm |

As can be seen from the table, UV absorption maxima move to longer wavelengths as chain length increases for both hydrocarbons and fluorocarbons. Perfluorocarbon chains $(CF_2)_n$ absorb at 157 nm somewhere between n=6 (142 nm) and n=172 (161 nm) while hydrocarbon chains $(CH_2)_n$ absorb at 157 nm perhaps as early as n=2. But, as long as chain lengths offering acceptable transparency are limited to $(CH_2)$ or $(CH_2)_6$, perfectly transparent polymers at 157 nm and somewhat longer wavelengths would seem precluded according to the known art. Consistent with this, V. N. Vasilets, et al., J. Poly. Sci, Part A, Poly. Chem., 36, 2215(1998) for example report that various compositions of poly(tetrafluoroethylene/hexafluoropropylene) show strong absorption and photochemical degradation at 147 nm. Similarly the inventors hereof have found that 1:1 poly(hexafluoropropylene:tetrafluoroethylene) is highly absorbing at 157 nm The absorbance per micron of a polymer will determine the average transmission of an unsupported pellicle film made from that polymer. For any particular polymer, the pellicle transmission can be increased, through the use of a thinner pellicle film thickness. This approach to increasing the pellicle transmission has a limited range of utility, since the pellicle film must have sufficient mechanical strength and integrity. These mechanical requirements suggest the use of polymer with relatively high glass transition temperature Tg and polymer film thicknesses of 0.6 microns or greater.

SUMMARY OF THE INVENTION

This invention provides a method comprising causing a source to emit electromagnetic radiation in the wavelength range from 150 nanometers to 260 nanometers; disposing a target surface in the path of at least a portion of said electromagnetic radiation in such a manner that at least a portion of said target surface will be thereby illuminated; and interposing in the path of at least a portion of said electromagnetic radiation between said target surface and said source a shaped article comprising a fluoropolymer exhibiting an absorbance/micrometer ≦1 at wavelengths in the range of 150 to 260 nm and a heat of fusion of <1 J/g said fluoropolymer being a homopolymer selected from group A or copolymers from groups B, C, and D wherein group A consists of the homopolymer of $CH_2$=$CFCF_3$ group B consists of copolymers comprising >25 mole % of monomer units derived from $CF_2$=$CHOR_f$ in combination with monomer units derived from vinylidene fluoride wherein $R_f$ is a linear or branched C1 to C6 fluoroalkyl radical having the formula $C_nF_{2n-y+1}Hy$ wherein the number of hydrogens is less than or equal to the number of fluorines, no more than two adjacent carbons atoms are bonded to hydrogens, and either oxygen can replace one or more of the carbons providing at least one of the carbons adjacent to any ether oxygen is perfluorinated;

group C consists of copolymers comprising >10 mole % of monomer units derived from $CH_2=CFCF_3$, $CF_2=CHOR_f$, or a mixture thereof in combination with monomer unit derived from 1,3 perfluorodioxoles wherein $R_f$ is a linear or branched C1 to C6 fluoroalkyl radical having the formula $C_nF_{2n-y+1}Hy$ wherein the number of hydrogens is less than or equal to the number of fluorines, no more than two adjacent carbon atoms are bonded to hydrogens, and ether oxygen can replace one or more of the carbons providing at least one of the carbons adjacent to any oxygen is perfluorinated, and wherein said 1,3-perfluorodioxole has the structure

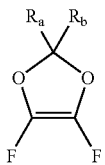

wherein $R_a$ and $R_b$ are independently F or linear $-C_nF_{2n+1}$, optionally substituted by ether oxygen, for which n=1 to 5.

group D consists of copolymers comprising 40 to 60 mole % of monomer units derived from a monomer represented by the formula

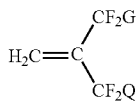

in combination with monomer units derived from vinylidene fluoride and or vinyl fluoride wherein G and Q are independently F (but not both F), H, $R_f$, or $-OR_f$ wherein $R_f$ is a linear or branched C1 to C5 fluoroalkyl radical having the formula $C_nF_{2n-y+1}H_y$, wherein the number of hydrogens is less than or equal to the number of fluorines, no more than two adjacent carbons atoms are bonded to hydrogens, and ether oxygen can replace one or more of the carbons providing that at least one of the carbons adjacent to any ether oxygen is perfluorinated.

Further provided in the present invention is an apparatus comprising an activateable source of electromagnetic radiation in the wavelength range of 150-260 nanometers; and a shaped article comprising a fluoropolymer exhibiting an absorbance/micron $\leqq 1$ at wavelengths from 150 to 260 nm and a heat of fusion of <1 J/g said fluoropolymer being a homopolymer selected from group A or copolymers from groups B, C, and D wherein group A consists of the homopolymer of $CH_2=CFCF_3$ group B consists of copolymers comprising >25 mole % of monomer units derived from $CF_2=CHOR_f$ in combination with monomer units derived from vinylidene fluoride wherein $R_f$ is a linear or branched C1 to C6 fluoroalkyl radical having the formula $C_nF_{2n-y+1}H_y$ wherein the number of hydrogens is less then or equal to the number of fluorines, no more than two adjacent carbons atoms are bonded to hydrogens, and ether oxygen can replace one or more of the carbons providing at least one of the carbons adjacent to any ether oxygen is perfluorinated;

group C consists of copolymers comprising >10 mole % of monomer units derived from $CH_2=CFCF_3$, $CF_2=CHOR_f$, or a mixture thereof in combination with monomer unit derived from 1,3 perfluorodioxoles wherein $R_f$ is a linear or branched C1 to C6 fluoroalkyl radical having the formula $C_nF_{2n-y+1}H_y$, wherein the number of hydrogens is less than or equal to the number of fluorines, no more than two adjacent carbons atoms are bonded to hydrogens, and ether oxygen can replace one or more of the carbons providing at least one of the carbons adjacent to any oxygen is perfluorinated, and wherein said 1,3-perfluorodioxole has the structure

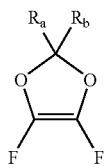

wherein $R_a$ and $R_b$ are independently F or linear $-C_nF_{2n+1}$, optionally substituted with ether oxygen, for which n=1 to 5.

group D consists of copolymers comprising 40 to 60 mole % of monomer units derived from a monomer represented by the formula

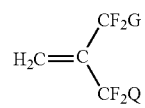

in combination with monomer units derived from vinylidene fluoride and or vinyl fluoride wherein G and Q are independently F (but not both F), H, $R_f$, or $-OR_f$ wherein $R_f$ is a linear or branched C1 to C5 fluoroalkyl radical having the formula $C_nF_{2n-y+1}H_y$, wherein the number of hydrogens is less than or equal to the number of fluorines, no more than two adjacent carbons atoms are bonded to hydrogens, and ether oxygen can replace one or more of the carbons providing that at least one of the carbons adjacent to any ether oxygen is perfluorinated;

said shaped article being disposed to lie within the optical path of light emitted from said source when said source is activated.

This invention further provides pellicles, anti-reflective coatings, optically clear glues, light guides and resists comprising the UV transparent material described herein.

DETAILED DESCRIPTION OF THE INVENTION

Figure 1:
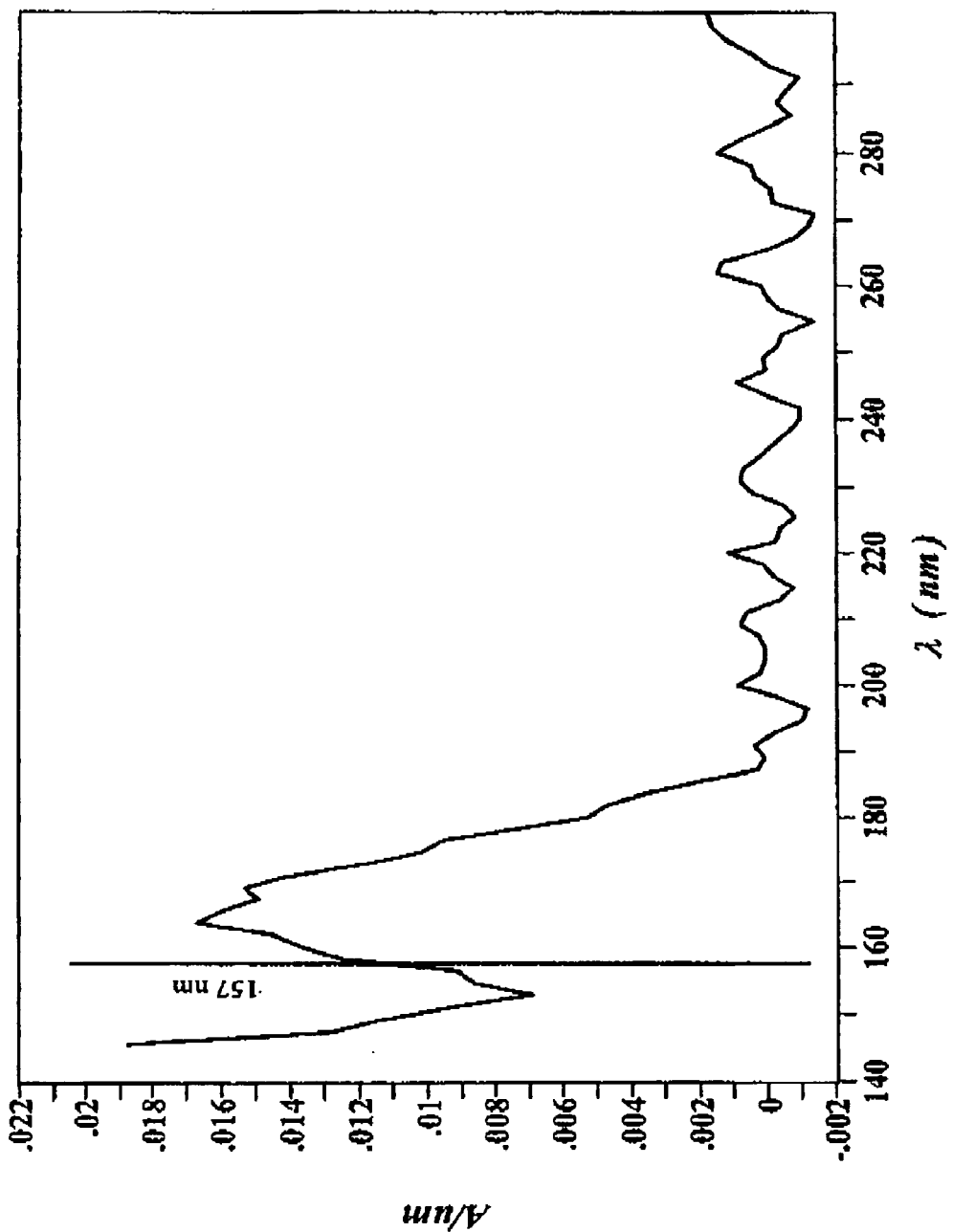
FIG. 1 describes the absorbance in units of inverse micrometers versus wavelength lambda (λ) in units of nanometers for the polymer of Example 1 (Poly[($CH_2=C(CF_3)CF_2OCH(CF_3)_2/CH_2=CF_2$).

The method of the present invention has several embodiments, all related to the use of electromagnetic radiation in the range of 150 nm to 260 nm for illuminating a surface. In a preferred embodiment of the method of the invention, the method is applied in the area of photolithographic processes for the fabrication of circuit elements in electronics as described hereinabove and in the references cited. In other embodiments, the method may be applied to vacuum ultraviolet spectroscopy, or in microscopy. Since the novelty of the method lies in the use of polymeric materials heretofore unknown to be useful for transmitting electromagnetic radiation in the wavelength region from 150 nm-260 nm in there is no limitation on the number of potential embodiments just so long as the elements of the present method are applied.

In the method of the invention, a source of electromagnetic radiation such as a lamp (such as a mercury or mercury-xenon lamp, a deuterium lamp or other gas discharge lamp of either the sealed or flowing gas type), an excimer lamp such as produces 172 nm radiation or other lamps), a laser (such as the excimer gas discharge lasers which produce 248 nm electromagnetic radiation from KrF gas, 193 nm radiation from ArF gas or 157 nm from F2 gas, or frequency up converted as by non linear optical processes of laser whose emission in in the ultraviolet, visible or infrared), a black body light source at a temperature of at least 2000 degrees kelvin. An example of such a black body light source being a laser plasma light source where by a high powered laser is focused to a small size onto a metal, ceramic or gas target, and a plasma is formed as for example in the samarium laser plasma light source whereby a black body temperature on the order of 250,000 degrees Kelvin is achieved, and black body radiation from the infrared to the x-ray region can be produced, LPLS light sources which emits radiation in the wavelength range from 150 nm to 260 nm are discussed in greater detail in R. H. French, "Laser-Plasma Sourced, Temperature Dependent VUV Spectrophotometer Using Dispensive Analysis", *Physica Scripta*, 41, 4, 404-8, (1990)). In a preferred embodiment, the source is an excimer gas discharge laser emitting at 157 nm, 193 nm, or 248 nm, most preferably, 157 nm.

At least a portion of the light emitted from the source is directed to a target surface at least a portion of which will be illuminated by the incident light. In a preferred embodiment, the target surface is to be a photopolymer surface which undergoes light-induced chemical reaction in response the incidence of the radiation. Clariant has just introduced a 157 nm fluoropolymer resist under the name AZ EXP FX 1000P which is likely a hydrofluorocarbon polymer incorporating ring structures for etch stability and protected fluoroalcohol groups for aqueous base solubility.

In the process for manufacturing semiconductor devices, very fine features are etched onto a substrate, typically a silicon wafer. The features are formed on the substrate by electromagnetic radiation which is impinged, imagewise, on a photoresist composition applied to the silicon wafer. Areas of the photoresist composition which are exposed to the electromagnetic radiation change chemically and/or physically to form a latent image which can be processed into an image for semiconductor device fabrication. Positive working photoresist compositions generally are utilized for semiconductor device manufacture.

The photoresist composition typically is applied to the silicon wafer by spin coating. The silicon wafer may have various other layers applied to it in additional processing steps. Examples of such additional layers such as are known in the art include but are not limited to a hard mask layer, typically of silicon dioxide or silicon nitride, and an antireflective layer. Typically the thickness of the resist layer is sufficient to resist the dry chemical etch processes used in transferring a pattern to the silicon wafer.

A photoresist is typically comprised of a polymer and at least one photoactive component. The photoresists can either be positive-working or negative-working. Positive-working photoresists are preferred. These photoresists can optionally comprise dissolution inhibitors and/or other additional components such as are commonly employed in the art. Examples of additional components include but are not limited to, resolution enhancers, adhesion promoters, residue reducers, coating aids, plasticizers, and $T_g$ (glass transition temperature) modifiers.

Various polymer products for photoresist compositions have been described in *Introduction to Microlithography, Second Edition* by L. F. Thompson, C. G. Willson, and M. J. Bowden, American Chemical Society, Washington, D. C., 1994.

The photoresist composition generally comprises a film forming polymer which may be photoactive and a photosensitive composition that contains one or more photoactive components. Upon exposure to electromagnetic radiation (e.g., UV light), the photoactive component acts to change the rheological state, solubility, surface characteristics, refractive index, color, optical characteristics or other such physical or chemical characteristics of the photoresist composition.

Shorter wavelengths correspond to higher resolution.

Imagewise Exposure

The photoresist compositions suitable for use in the process of the instant invention are sensitive in the ultraviolet region of the electromagnetic spectrum and especially to those wavelengths ≦365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, more preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Suitable laser devices for imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. These excimer lasers could be used for digital imaging, but thy are also the basis for non-digital imaging using photomasks in optical steppers. Optical steppers for 248 nm can use lamps or KrF excimer laser light sources, and at 193 and 157 nm the light source is an excimer laser, 193 nm=ArF and 157 nm=F2 excimer laser. Since, as discussed supra, use of UV light of lower wavelength for imagewise exposure corresponds to higher resolution the use of a lower wavelength (e.g., 193 nm or 157 nm or lower) is generally preferred over use of a higher wavelength (e.g., 248 nm or higher).

Development

The polymers suitable for use in the present invention can be formulated as a positive resist wherein the areas exposed to UV light become sufficiently acidic to be selectively washed out with aqueous base. Sufficient acidity is imparted to the copolymers by acid or protected acid (which can be 100% in protected form prior to exposure provided deprotection occurs during exposure to afford sufficient free acid to provide for development) such that aqueous development is possible using a basic developer such as sodium hydroxide solution, potassium hydroxide solution, or tetramethylammonium hydroxide solution. In this invention, a given copolymer for aqueous processability (aqueous development) in use is typically a carboxylic acid-containing and/or fluoroalcohol-containing copolymer (after exposure) containing at least one free carboxylic acid group and/or fluoroalcohol group. The level of acid groups (e.g., free carboxylic acid or fluoroalcohol groups) is determined for a given composition by optimizing the amount needed for good development in aqueous alkaline developer.

When an aqueous processible photoresist is coated or otherwise applied to a substrate and imagewise exposed to UV light, the copolymer of the photoresist must have sufficient protected acid groups and/or unprotected acid groups so that when exposed to UV the exposed photoresist will become developable in basic solution. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds) or 1% sodium carbonate by weight (with development at a temperature of 30° C. usually for less than 2 or equal to 2 minutes). In case of a negative-working photoresist layer, the photoresist layer will be removed during development in portions which are unexposed to UV radiation but will be substantially unaffected in exposed portions during development using either a supercritical fluid or an organic solvent.

Halogenated solvents are preferred and fluorinated solvents are more preferred.

In a further embodiments, the target surface may be an optical sensor which produces an electronic, optical, or chemical signal in response to the incident radiation such as in the signal or image wise receiver in an optical, electo-optical or electronic detector used in time based, wavelength based or spatially resolved optical communications systems. In these cases the electromagnetic radiation incident on the target surface, and its time variation, spatial variation and/or its wavelength (spectral) variations can be used to encode information which can then be decoded at the detector. In another embodiment, the target surface may be a electro-optical receptor of the type used for light to energy conversion. In another embodiment, the target surface may be a specimen undergoing microscopic examination in the wavelength range of 150-260 nm. In yet another embodiment, the target surface may be a luminescent surface caused to luminesce upon incidence of the 150-260 nm radiation employed in the method of the invention such as in a imaging system used as an optical imaging display. In another embodiment, the target surface may be a specimen undergoing materials processing, such laser ablation, laser trimming laser melting, laser marking in the wavelength range from 150 nm to 260 nm, According to the method of the invention, a shaped article comprising a transparent, amorphous fluoropolymer as hereinbelow described, is interposed between the light source and the target. In one embodiment of the method of the invention the fluoropolymer of the invention is employed in an adhesive. In another embodiment of the method, the material is employed as a coating or an element to provent the outgassing under irradiation of dissimilar materials in the system so as to reduce optical contamination by more optically absorbing materials. In another embodiment the adhesivelike material is used as a coating or element or so as to capture and immobilize particulate contaminants, to avoid their further mitigation and deposition in the system. In another emboidment the fluoropolymer is employed as a coating on a non-optical (element (such as a support structure in an optical instrument), an optical element (such as a mirror, a lens, a beam splitter, a tuned etalon, a detector, a pellicle,). In a further embodiment, the fluoropolymer is itself a shaped article such as a lens or other optical element (such as a mirror, a lens, a beam splitter, a tuned etalon, a detector, a pellicle,) or non optical component (such as a support structure in an optical instrument). In the most preferred embodiment the fluoropolymer is in the form of a pellicle, a free standing membrane mounted on a frame (which can be metallic, glass, polymer or other material) which is attached (adhesively or using other methods such as magnetism) to the surface of a photomask employed in a photolithographic process conducted in the wavelength region from 150 nm to 260 nm. More preferably, the photolithographic process employs a laser emitting radiation at 157 nm, 193 nm, or 248 nm. Most preferably, the photolithographic process employs a laser emitting 157 nm radiation.

In the apparatus of the invention is employed an activateable light source of the type described hereinabove as suitable for use in the method of the invention. By "activateable" is meant that the light source may be, in conventional terms, "on" or "off" but if in the "off" state may be turned on by conventional means. This light source may also have multiple wavelengths (as is used in wavelength division multiplexing in optical communications) through the use of lamps or multiple lasers of different wavelengths. Thus encompassed within the apparatus of the invention is a light source which may be "off" when so desired, as when the apparatus is not being used, or is being shipped. However, the light source of the invention can be activated—that is, turned "on"—when it is desired to use it as, for example, in the method of the present invention. When turned "on" or activated, the light source emits electromagnetic radiation in the wavelength range from 150 nm-260 nm. Light sources suitable for use in the apparatus of the invention include a lamp (such as a mercury or mercury-xenon lamp, a deuterium lamp or other gas discharge lamp of either the sealed or flowing gas type), an excimer lamp such as produces 172 nm radiation or other lamps), a laser (such as the excimer gas discharge lasers which produce 248 nm electromagnetic radiation from KrF gas, 193 nm radiation from ArF gas or 157 nm from F2 gas, or frequency up converted as by non linear optical processes of laser whose emission in in the ultraviolet, visible or infrared), a black body light source at a temperature of at least 2000 degrees Kelvin, an example of such a black body light source being a laser plasma light source where by a high powered laser is focused to a small size onto a metal, ceramic or gas target, and a plasma is formed as for example in the samarium laser plasma light source whereby a black body temperature on the order of 250,000 degrees Kelvin is achieved, and black body radiation from the infrared to the x-ray region can be produced) which emits radiation in the wavelength range from 150 nm to 260 nm. In a preferred embodiment, the source is a excimer gas discharge laser emitting at 157 nm, 193 nm, or 248 nm, most preferably, 157 nm.

Further employed in the apparatus of the invention is a shaped article comprising the fluoropolymer of the invention, hereinbelow described. In the apparatus of the invention, the shaped article is disposed to lie within the path of electromagnetic radiation emitted from the source when the source is activated or "turned on." In one embodiment of the apparatus of the invention the shaped article employs the fluoropolymer of the invention is an adhesive. In another embodiment the fluoropolymer is employed as a coating on an optical or non-optical element. In a further embodiment, the fluoropolymer is itself formed into a shaped article such as a lens or other optical component. In the most preferred embodiment the fluoropolymer is in the form of a pellicle, a protective film typically 0.6 to 1 micron thick that is mounted on a frame that is attached in turn to the surface of a photomask employed in a photolithographic process conducted in the wavelength region from 150 nm to 260 nm.

While one of skill in the art will appreciate that the method of use contemplated for the apparatus of the invention necessarily comprises a target surface of some sort, the apparatus of the invention need not encompass a target surface. For example, the apparatus of the invention could be employed as a portable or transportable optical irradiation system with a light source and a set of optical components which could be used on a variety of target surfaces in several locations.

Pellicle film thickness can be optimized such that the pellicle will exhibit a thin film interference with a maximum in the in the transmission spectrum at the desired lithographic wavelength. The spectral transmission maximum of a properly tuned etalon pellicle film occurs where the spectral reflectance of the pellicle film exhibits a minimum.

Polymers suitable for the practice of the invention exhibit very low absorbance/micron, at least <1, preferably <0.5, more preferably <0.1, and most preferably <0.01. Those which further exhibit values of the index of refraction which match the index of adjacent optical elements have important uses antireflective index matching materials and optically clear index matching adhesives, those which exhibit intermediate values of the index of refraction between those of an optical element and either the ambient (with an index of 1 for example) or a second adjacent element of a different index of refraction have important applications as anti-reflection coatings and those have a low value of the index of refractions below 1.8, or preferably below 1.6 or more preferably below 1.45 have very important applications as multilayer anti-reflection coatings. Such polymers can be used to reduce the light reflected from the surface of a transparent substrate of a relatively higher index of refraction. This decrease in the reflected light, leads to a concomitant increase in the light transmitted through the transparent substrate material.

The polymers suitable for the practice of the present invention may be homopolymers or copolymers. The suitable homopolymer is selected from group A. Suitable copolymers are selected from groups B, C, and D wherein group A consists of the homopolymer of $CH_2\!=\!CFCF_3$
group B consists of copolymers comprising >25 mole % of monomer units derived from $CF_2\!=\!CHOR_f$ in combination with monomer units derived from vinylidene fluoride wherein $R_f$ is a linear or branched C1 to C6 fluoroalkyl radical having the formula $C_nF_{2n-y+1}H_y$ wherein the number of hydrogens is less than or equal to the number of fluorines, no more than two adjacent carbons atoms are bonded to hydrogens, and either oxygen can replace one or more of the carbons providing at least one of the carbons adjacent to any ether oxygen is perfluorinated;

group C consists of copolymers comprising >10 mole % of monomer units derived from $CH_2\!=\!CFCF_3$, $CF_2\!=\!CHOR_f$, or a mixture thereof in combination with monomer unit derived from 1,3 perfluorodioxoles wherein $R_f$ is a linear or branched C1 to C6 fluoroalkyl radical having the formula $C_nF_{2n-y+1}H_y$ wherein the number of hydrogens is less than or equal to the number of fluorines, no more than two adjacent carbons atoms are bonded to hydrogens, and ether oxygen can replace one or more of the carbons providing at least one of the carbons adjacent to any oxygen is perfluorinated, and wherein said 1,3-perfluorodioxole has the structure

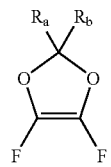

wherein $R_a$ and $R_b$ are independently F or linear $-C_nF_{2n+1}$, optionally substituted by ether oxygen, for which n=1 to 5.

group D consists of copolymers comprising 40 to 60 mole % of monomer units derived from a monomer represented by the formula

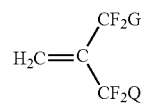

in combination with monomer units derived from vinylidene fluoride and or vinyl fluoride wherein G and Q are independently F (but not both F), H, $R_f$, or $-OR_f$ wherein $R_f$ is a linear or branched C1 to C5 fluoroalkyl radical having the formula $C_nF_{2n-y+1}H_y$ wherein the number of hydrogens is less then or equal to the number of fluorines, no more than two adjacent carbons atoms are bonded to hydrogens, and ether oxygen can replace one or more of the carbons providing that at least one of the carbons adjacent to any ether oxygen is perfluorinated.

The polymers suitable for the practice of the present invention are useful in the manufacture of transmissive and reflective optical elements, such as lenses and beam splitters mirrors and etalons, for use in the vacuum UV region.

The polymers suitable for the present invention may also be used as elements in a compound lens designed to reduce chromatic aberrations. At present only $CaF_2$ and possibly hydroxyl free silica are viewed as having sufficient transparency at 157 nm to be used in transmissive focussing elements. It is also commonly known (e.g. see R. Kingslake, Academic Press, Inc., 1978, Lens Design Fundamentals, p. 77) that by using a second material of different refractive index and dispersion, an achromatic lens can be created. Thus, by using one of these materials in conjunction with $CaF_2$, it is expected that an achromatic lens can be constructed from this and other similar materials described in this application.

An additional area in which polymers play a critical role is as the photosensitive photoresist which captures the optical latent image. In the case of photoresists, light must penetrate the full thickness of the resist layer for a latent optical image, with well defined vertical side walls to be produced during optical imaging which then will produce the desired resist image in the developed polymer. When used as a resist at 157 nm, a polymer can have a considerably higher absorption coefficient of A<~2-3 per micrometer of film thickness, if the resist thickness is limited to about 2000 Å.

As used herein, the term amorphous fluoropolymer means a fluoropolymer that exhibits no melting point when analyzed by Differential Scanning Calorimetry. No melting point means no melting associated thermal event of greater than 1 Joule/gram.

Listing a monomer as a precursor to transparent polymers is not meant to imply that it will either homopolymerize or form a copolymer with any other listed monomer. Hexafluoroisobutylene for example, does not form useful homopolymer or copolymerize with tetrafluoroethylene under ordinary conditions. While these materials are being claimed for use at 150 to 260 nm, they also make excellent clear polymers at longer wavelengths, up to 800 nm, and may also be suitable for some applications at still shorter wavelengths.

Syntheses of $R_1R_2C=CH_2$ monomers are well known in the art. $R_1=CF_3$, $R_2=C_2F_5$ has been made by treating 2-trifluoromethyl-3-chloro-4,4,4-trifluoro-2-butenyl p-toluenesulfonate with KF Ltd.).(Japanese Patent Application JP 95-235253). $R_1=R_2=CF_2H$ has been made by treating $(HCF_2)_2C(OH)Me$ with $SF_4$(U.S. Pat. No. 3,655,788). $R_1=CF_3$, $R_2=CF_2H$ and $R_1=R_2=CF_2Cl$ have been made by reacting the corresponding fluoroalcohol $R_1C(OH)MeR_2$ with $PCl_6$ (German Patent 1945614), $R_1R_2C=CH_2$ can also be made by methods developed for hexafluoroisobutylene such as heating $(CF_3)_2CMeCOF$ with metal halides (Japanese Patent Application JP 93-312470), by reacting $(CF_3)_2CHCOOMe$ with HCHO in the presence of amines (Japanese Patent Application JP 86-52298), by reacting hexafluoroacetone with acetic anhydride at high temperatures (U.S. Pat. No. 3,894,097, Allied Corp. USA), by the reaction of $(CF_3)_2C(OH)_2$ with acetic anhydride at high temperatures (German Patent Application DE 84-3425907), and by the reaction of $(CF3)2CHCH2OH$ with base (S. Misaki, S. Takamatsu, J. Fluorine Chem., 24(4), 531-3 (1984). In one embodiment of the invention are employed copolymers of CF2=CHORf with vinylidene fluoride (VF2) and perfluoro-1,3-dioxoles where Rf is defined as a linear or branched C1 to C6 $C_nF_{2n-y+1}H_y$ group in which the number of hydrogens is less than or equal to the number of fluorines, no more than two adjacent carbons atoms are bonded to hydrogens, and ether oxygen can replace one or more of the carbons providing at least one of the carbons adjacent to any ether oxygen is perfluorinated. The monomers can be present in any ratio as long as the content of VF2 is not so high as to introduce crystallinity (more than about 75% VF2) or the PDD content so high as to make for low solubility (more than about 90% PDD).

Monomers such as vinylidene fluoride, PDD, and 2,3,3,3-tetrafluoropropene-1 are items of commerce either as pure monomers or incorporated in commercial polymers. Numerous substituted perfluoro-1,3-dioxoles are described in J. Sheirs, editor, *Modern Fluoropolymers*, John Wiley and Sons, West Sussex, England, 1997, p. 400. Monomers CF2=CHORA where RA is a linear or branched C2 to C20 carbon group substituted with H, F, and other elements has been reported in U.S. Pat. No. 6,300,526B1, along with a general synthetic method that involves the reaction of a 2-halo-2,2-difluoroethylic alcohol with a florinated olefin in the presence of an alkaline or alkaline earth hydroxide followed by dehydrohalogenation. The monomer CF2=CHOCF2CF2H was made by reacting TFE with ClCF2CH2OH and KOH to give the ClCF2CH2OCF2CF2H adduct which was then dehydrochlorinated with base and heat. CF3OCH=CF2 has been reported by Paul D. Schuman, Sci. Tech. Aerospace Rept. 1966, 4 (6), N66-15770. Higher homologs RfOCH=CF2 in which Rf is a perfluoroalkyl group should be available by combining the hypofluorite/dehydrohalogenation chemistries in EP 0683 181 A1 with Navarrini, et al., *J. Fluorine Chem.*, 95, 27(1999). An alternative method of making RfOCH=CF2 was developed here to avoid the difficulties of making and working with hypofluorites: ester formation, fluorination with SF4, and dehydrohalogenation.

2,3,3,3-tetrafluoropropene-1 homopolymer has been reported (D. Brown, L. Wall, Polym. Prepr., Amer. Chem. Soc., Div. Polym. Chem. 1971, 12, 1, pgs. 302-304) and 2,3,3,3-tetrafluoropropene has been reported to copolymerize with a variety of other fluorocarbon and hydrocarbon monomers (U.S. Pat. No. 5,637,663, JP 09288915 A2 19971104).

The starting material for the CH2=C(CF3)CF2OR family of monomers is hexafluoroisobutylene fluorosulfate, CH2=C(CF3)CF2OSO2F. Hexafluoroisobutylene fluorosulfate is made by the reaction of hexafluoroisobutylene with sulfur trioxide in the presence of B(OC2H5)3 catalyst. Alkoxide anions RO— can then be used to displace the fluorosulfate group in hexafluoroisobutylene fluorosulfate giving the desired CH2=C(CF3)CF2OR monomers. This chemistry can be run in dry, aprotic solvents that support alkoxide anion formation and that dissolve the hexafluoroisobutyene fluorosulfate. Possible solvents include diethylene glycol dimethyl ether, tetramethylene sulfone, and acetonitrile with diethyleneglycol dimethyl ether being preferred. Reaction temperatures range from −50° C. to 100° C. A preferred reaction temperature is from −25 to +25° C., preferably from −15 to −5° C. While hydrocarbon, fluorohydrocarbon, or fluorocarbon alkoxides can be used for the displacement of the fluorosulfate group, high UV transparency results when R is a linear or branched C1 to C6 fluoroalkyl radical having the formula $C_nF_{2n-y+1}H_y$ wherein the number of hydrogens is less than or equal to the number of fluorines, no more than two adjacent carbons atoms are bonded to hydrogens, and ether oxygen can replace one or more of the carbons providing at least one of the carbons adjacent to any ether oxygen is perfluorinated.

Polymers produced from the above monomers may be prepared as follows. Polymer synthesis can be done by any of the nonaqueous or aqueous emulsion techniques well known to fluoroolefin polymerizations. In nonaqueous polymerization, an autoclave is most frequently charged with solvent, initiator, and monomers. The solvent is typically a fluid that does not interfere with the growing radical chain: this can include neat monomer, compressed gases such as carbon dioxide, or more conventionally, fluids such as Vertrel™ XF (CF3CFHCFHCF2CF3), Solkane™ 365 mfc (CF3CH2CF2CH3). Freon™ 113 (CF2ClCCl2F), perfluorooctane, or Fluorinert™ FC-75. A great variety of radical sources are known to initiate fluoroolefin polymerizations including diacyl peroxides, dialkyl peroxides, hydroperoxides, peroxyesters, percarbonates, azo compounds, NF3, and highly sterically hindered perfluorocompounds for which appropriate initiation temperatures vary from ~0 to 300° C. In the the present invention preferred initiators are perfluorodiacylperoxides such as DP or perfluoropropionyl peroxide. In the case of DP, polymerizations can be run at 10 to 50° C., more preferably at 20 to 35° C. In the case of gaseous monomers such as vinylidene fluoride, typically enough monomer is added to generate an internal pressure of 50 to 1000 psi at operating temperature. These polymers can also be made by aqueous emulsion polymerization using initiators such as potassium persulfate or VazoTM 56 WSP [2,2'-]2,2'-azobis (2-amidinopropane)dihydrochloride] in the presence of surfactant. But the introduction of possibly contaminating surfactants and end groups can make emulsion polymerization undesirable for high UV transparency. In the case of the particular polymers being made here, the CH2=C(CF3) CF2OR content in the final polymers should be about 40 to 60 mole % because CH2=C(CF3)CF2OR prefers to alternate and VF2 content should be ~75 mole % or less since more VF2 leads to crystallinity.

EXAMPLES

Abbreviations employed herein include:
HFIB hexafluoroisobutylene
PDD 4,5-difluoro-2,2-bis(trifluoromethyl)-1,3-dioxole
DSC Differential scanning calorimetry
H-Galden® ZT 85 A trademark of Ausimont, $HCF_2O(CF_2O)_n(CF_2CF_2O)_mCF_2H$
DP: hexafluoropropyleneoxide dimer peroxide of structure $CF_3CF_2CF_2OCF(CF_3)(C=O)OO(C=O)CF(CF_3)OCF_2CF_2CF_3$
Novec™ HFE-7500, a product of 3M $CF_3CF(CF_3)CF(OC_2H_5)CF_2CF_2CF_3$
Vertrel® XF, a product of DuPont, $CF_3CFHCFHCF_2CF_3$
HFIB Fluorosulfate: $CH_2=C(CF_3)CF_2OSO_2F$ or 3,3-dihydro-2-trifluoromethylperfluoroallyl fluorosulfate.

The absorbance/micron of was measured for polymer films spin-coated on to $CaF_2$ substrates using standard method in the art as described in R. H. French, R. C. Wheland, D. J. Jones, J. N. Hilfiker, R. A. Synowicki, F. C. Zumsteg, J. Feldman, A. E. Feiring, "Fluoropolymers for 157 nm Lithography: Optical Properties from VUV Absorbance and Ellipsometry Measurements", Optical Microlithography XIII, SPIE Vol. 4000, edited by C. J. Progler, 1491-1502 (2000). The VUV transmission of each $CaF_2$ substrate was measured prior to the spin coating of the polymer film. Then the VUV transmission of the polymer film on that particular $CaF_2$ substrate was measured, using a VUV-Vase model VU-302 spectroscopic ellipsometer, which is capable of performing transmission measurements, made by J. A. Woollam Inc. (J. A. Woollam Co., Inc. Lincoln, Nebr. The film thickness was determined using a Filmetrics (Filmetrics Inc., San Diego, Calif. model F20 thin film measurement system. Using Equation 1, the spectral transmission and the film thickness, the values of the absorbance/micron for the polymers were calculated from 145 nm to longer wavelengths, including at 157, 193, and 248 nm.

Optical properties (index of refraction, "n" and extinction coefficient, "k") are determined from variable angle spectroscopic ellipsometry (VASE) at three incident angles covering the wavelength range from 143-800 nm, corresponding to an energy range of 1.5-8.67 eV. The polymer films were spin coated onto a silicon substrate. The VASE ellipsometer was manufactured by J. A. Woollam Company, 645 M Street, Suite 102, Lincoln, Nebr. 68508 USA. Optical constants were fit to these data simultaneously, using an optical model of the film on the substrate. See generally, O. S. Heavens, Optical Properties of Thin Solid Films, pp. 55-62, Dover, N.Y., 1991.

Example 1

Poly[($CH_2=C(CF_3)CF_2OCH(CF_3)_2/CH_2=CF_2$]1

A. Preparation of 1,1,5-trihydro-2,5-bis(trifluoromethyl)-4-oxo-perfluoro-1-hexene, $CH_2=C(CF_3)CF_2OCH(CF_3)_2$ monomer A 100 ml flask was charged with tributylamine (15 g), diglyme (15 ml), and hexafluoroisopropanol (13.7 g) in a dry box. HFIB fluorosulfate (20.0 g) was added dropwise at 3-12° C. The resulting mixture was stirred at room temperature for 2 hours. The mixture was fresh distilled to give a liquid, which was then spinning band distilled to afford 21.1 g product, bp 92-3° C., yield 83%. (Less pure fractions were not counted.) 19 F NMR (CDCl3) −65.3 (t, J=7 Hz, 3 F), −70.8 (m, 2 F), −74.0 (q, J=5 Hz, 6 F) ppm. 1 H NMR (CDCl3) 4.99 (septet, J=5 Hz, 1 H), 6.37 (m, 2 H) ppm. 13 C NMR (CDCl3) 69.4 (septet, t, J=35.4 Hz), 118.8 (t, J=269 Hz), 120.2(q, J=283 Hz), 120.6 (sextet, J=5 Hz), 130.9 (sextet, J=35 Hz) ppm.

B. $CH_2=C(CF_3)CF_2OCH(CF_3)_2$ copolymerization with $CH_2=CF_2$

A 75 ml stainless steel autoclave chilled to <−20° C. was loaded with 11.6 g of $CH_2=C(CF_3)CF_2OCH(CH_3)_2$ monomer, 10 ml of $CH_3CH_2CF_2CH_3$ solvent, and 10 ml of ~0.17 M DP in $CF_3CFHCFHCF_2CF_3$. The autoclave was chilled, evacuated and further loaded with ~2 g of vinylidene fluoride. The autoclave was shaken overnight at room temperature. The resulting hazy fluid was dried under nitrogen, then under pump vacuum, and finally for 66 hours in a 75° C. vacuum oven, giving 12.9 g of white polymer. Fluorine NMR in hexafluorobenzene found 53.4 mole % vinylidene fluoride and 46.6 mole % $CH_2=C(CF_3)CF_2OCH(CF_3)_2$. Inherent viscosity in hexafluorobenzene at 25° C. was 0.116 dL/g. A small sample was purified for DSC measurements by dissolving 0.5 g of polymer in 3 g of H Galden ZT 85 solvent [HCF2O(CF2O)m(CF2CF2O)nCF2H], filtering the haze off using a 0.45 micron PTFE syringe filter (Whatman Autovial®), evaporating off excess solvent, and drying in a 75° C. vacuum oven for 16 hours. The Tg was now 47° C. (10° C./min, N₂, second heat).

C. Solution preparation

A hazy solution was made by rolling 2 g of polymer with 18 g of H Galden™ ZT 85 solvent. The haze was removed by filtering first through a bed of chromatographic silica in a 0.45 μ glass fiber microfiber syringe filter (Whatman Autovial™), centrifuging at 15000 rpm, and finally filtering again through a 0.2 μ PTFE syringe filter (Gelman Acrodisc CR). Evaporation of 0.1192 g of this solution on a glass slide gave a clear film weighing (0.0085 g (solution ~7 wt % in solids).

D. Optical characterization Spinning of solution:

The polymer solution so prepared was spin coated in an enclosed vapor can spinner at spin speeds of 800 rpm for 30 seconds, after an initial 10 second vapor equilibration period onto CaF2 and silicon substrates with a subsequent post apply bake at 120 C for 2 minutes to produce polymer films of 9200 angstroms thickness for VUV absorbance measurements and of 3523 angstroms thickness for VUV ellipsometry measurements. VUV absorbance measurements were then used to determine the absorbance per micrometer and VUV ellipsometry measurements of the films on silicon were used to determine the index of refraction.

Optical Results:

The absorbance in units of inverse micrometers for the polymer film so prepared versus wavelength lambda (λ) in units of nanometers is shown in FIG. 1. The 157 nm absorbance/micrometer determined was 0.011/micrometer. The 193 nm absorbance/micrometer determined was −0.002/micrometer. The 248 nm absorbance/micrometer determined was −0.002/micrometer.

Figure 2:
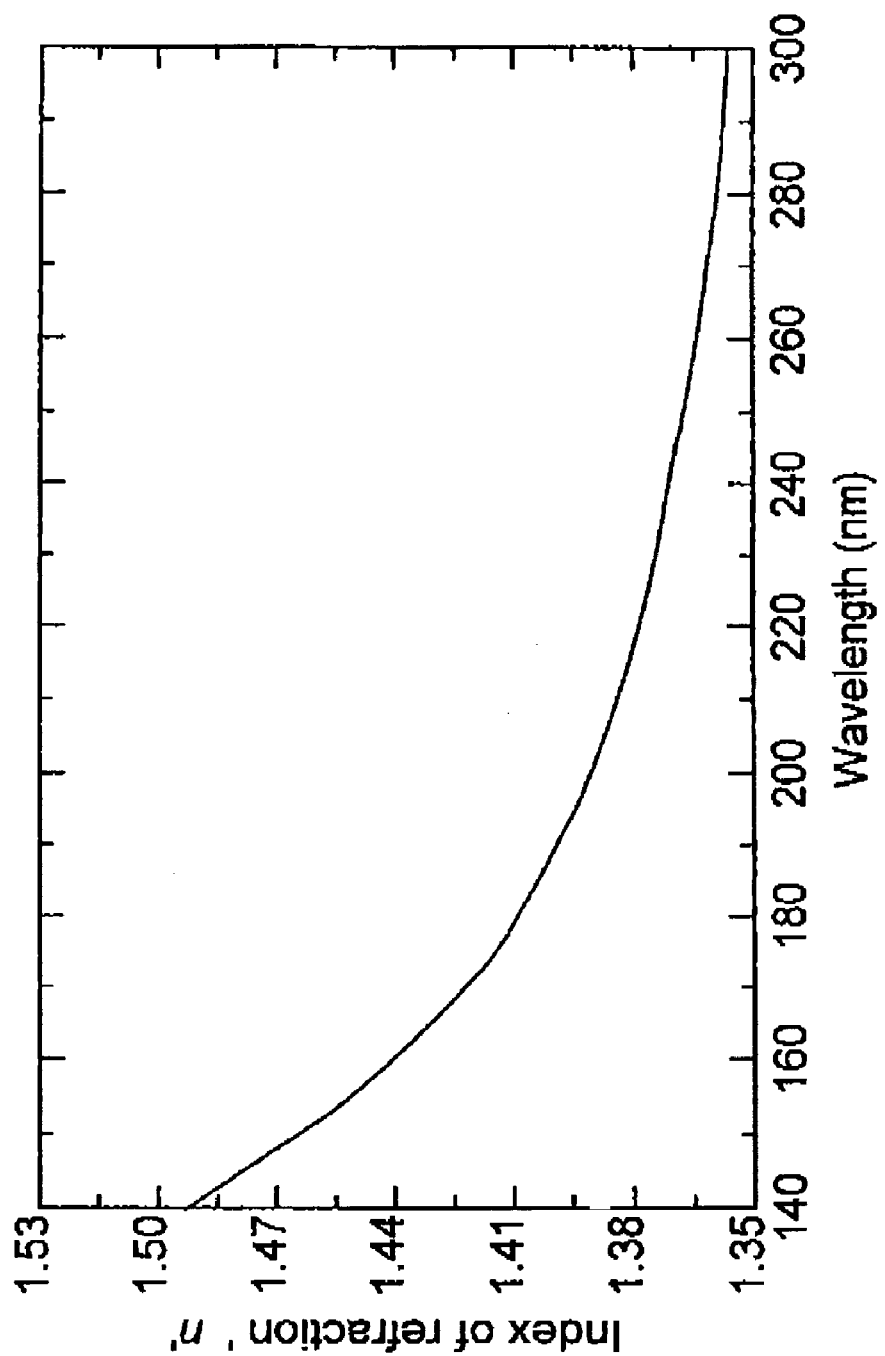
FIG. 2 describes the index of refraction (n) versus wavelength lambda (λ), in units of nanometers for the polymer of Example 1.
Figure 3:
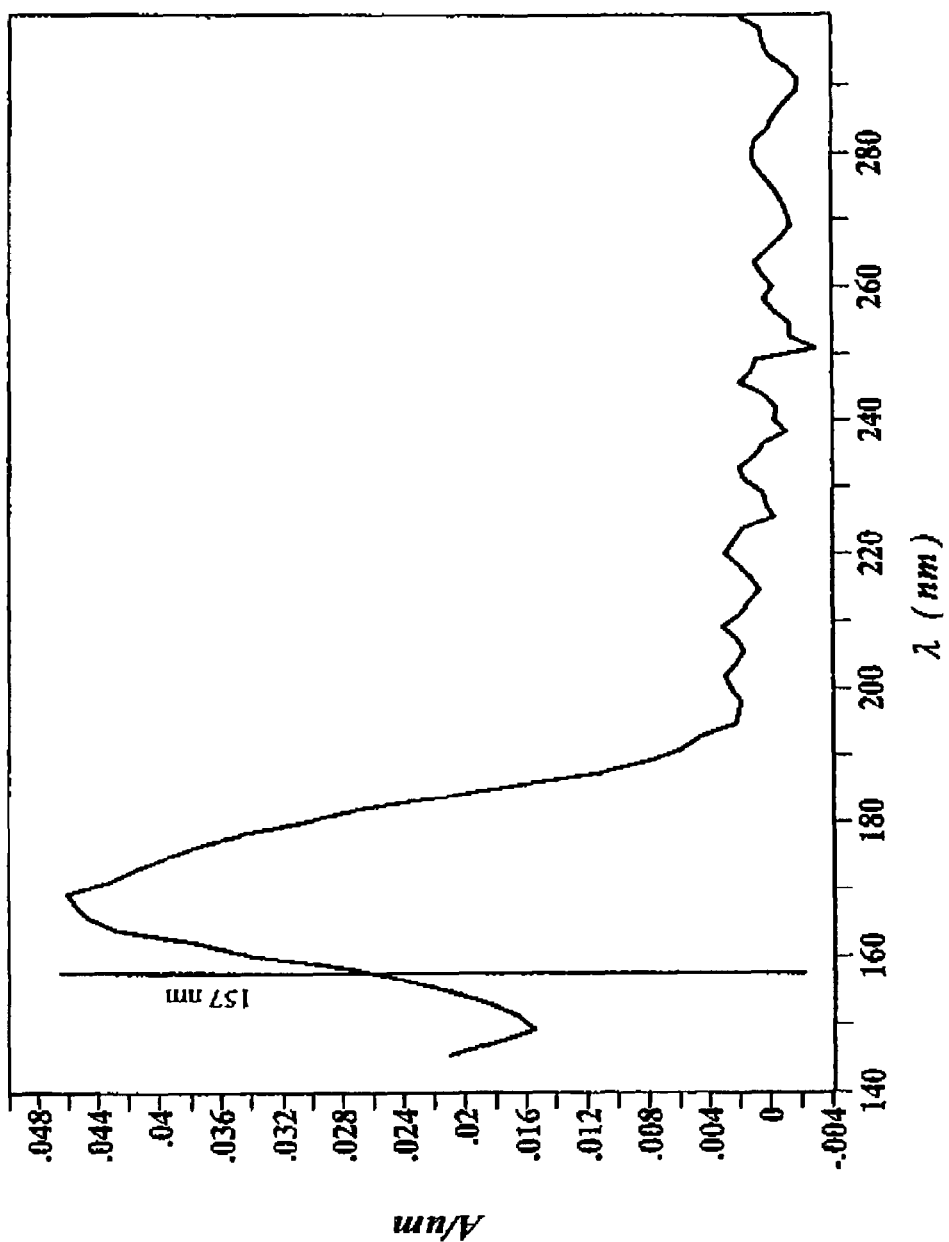
FIG. 3 describes the absorbance in units of inverse micrometers versus wavelength lambda (λ) in units of nanometers for the polymer of Example 2 (Poly[($CH_2=C(CF_3)CF_2OCF(CF_3)_2/CH_2=CF_2$).

The index of refraction for Polymer 1 versus wavelength lambda (λ) in units of nanometers is shown in FIG. 2. The 157 nm index of refraction determined is 1.45. The 193 nm index of refraction determined is 1.40. The 248 nm index of refraction is 1.37.

Example 2

Poly[(CH$_2$=C(CF$_3$)CF$_2$OCF(CF$_3$)$_2$/CH$_2$=CF$_2$]2

Preparation of 1,1-dihydro-2,5-bis(trifluoromethyl)-4-oxo-perfluorohex-1-ene, CH$_2$=C(CF$_3$)CF$_2$OCF(CF$_3$)$_2$ monomer A 250 ml flask was charged with KF (12 g) and diglyme (55 ml) in a dry box.

Hexafluoroacetone (40.5 g) was added to the mixture via a dry-ice condenser. The solid was dissolved completely. The HFIB fluorosulfate (49 g) was added dropwise. The resulting mixture was stirred at room temperature for 3 hours. The mixture was fresh distilled to give a liquid, which was then spinning band distilled to afford 36.3 g product, bp 84-86° C., yield 55%. (Less pure fractions were not counted.) 19 F NMR (CDCl3) −65.3 (t, J=8 Hz, 3 F), −66.6 (m, 2 F), −81.0 (m, 6 F), −146.4 (t, J=23 Hz, 1 F) ppm. 1 H NMR (CDCl3) 6.39 (m) ppm. 13 C NMR (CDCl3) 101.5 (d&septet, J=269, 38 Hz), 117.7 (qd, J=258, 32 Hz), 118.6 (t, J=274 Hz), 127.4 (m), 131.2 (m) ppm.

B. CH$_2$=C(CF$_3$)CF$_2$OCF(CF$_3$)$_2$ copolymerization with CH$_2$=CF$_2$ A 110 ml stainless steel autoclave chilled to <−20° C. was loaded with 26 g of CH$_2$=C(CF$_3$)CF$_2$OCF(CF$_3$)$_2$ monomer, 25 ml of CF$_3$CFHCFHCF$_2$CF$_3$ solvent, and 10 ml of ~0.17 M DP in CF$_3$CFHCFHCF$_2$CF$_3$. The autoclave was chilled, evacuated and further loaded with ~5 g of vinylidene fluoride. The autoclave was shaken overnight at room temperature. The resulting viscous fluid was dried under nitrogen, then under pump vacuum, and finally for 88 hours in a 75° C. vacuum oven, given 26.7 g of white polymer. Fluoride NMR run in hexafluorobenzene found 51 mole %

CH$_2$=C(CF$_3$)CF$_2$OCF(CF$_3$)$_2$ and 49 mole % CH$_2$=CF$_2$.

DSC, 10° C./min, N$_2$, 2nd heat neither Tg nor Tm detected Inherent Viscosity, hexafluorobenzene, 25° C.: 0.083

C. Solution preparation

A clear, colorless solution was made by rolling 2 g of polymer with 18 g of H Galden™ ZT 85 solvent and passing through a 0.45 μ glass fiber microfiber syringe filter (Whatman Autovial™)

D. Optical characterization

Spinning of solution:

The polymer solution so prepared was spin coated in a conventional atmosphere spinner at spin speeds of 90 rpm for the absorbance sample and 500 rpm for the ellipsometry sample for 30 seconds onto CaF2 and silicon substrates with a subsequent post apply bake at 120 C for 2 minutes to produce polymer films of 10800 angstroms thickness for VUV absorbance measurements and of 3757 angstroms thickness for VUV ellipsometry measurements. VUV absorbance measurements of the films on CaF$_2$ were then used to determine the absorbance per micrometer and VUV ellipsometry measurements of the films on silicon were used to determine the index of refraction.

Optical results:

The absorbance in units of inverse micrometers for the polymer film so prepared versus wavelength lambda (λ) in units of nanometers is shown in FIG. 2. The 157 nm absorbance/micrometer determined was 0.0275/micrometer. The 193 nm absorbance/micrometer determined was 0.0045/micrometer. The 248 nm absorbance/micrometer determined was 0.008/micrometer.

Figure 4:
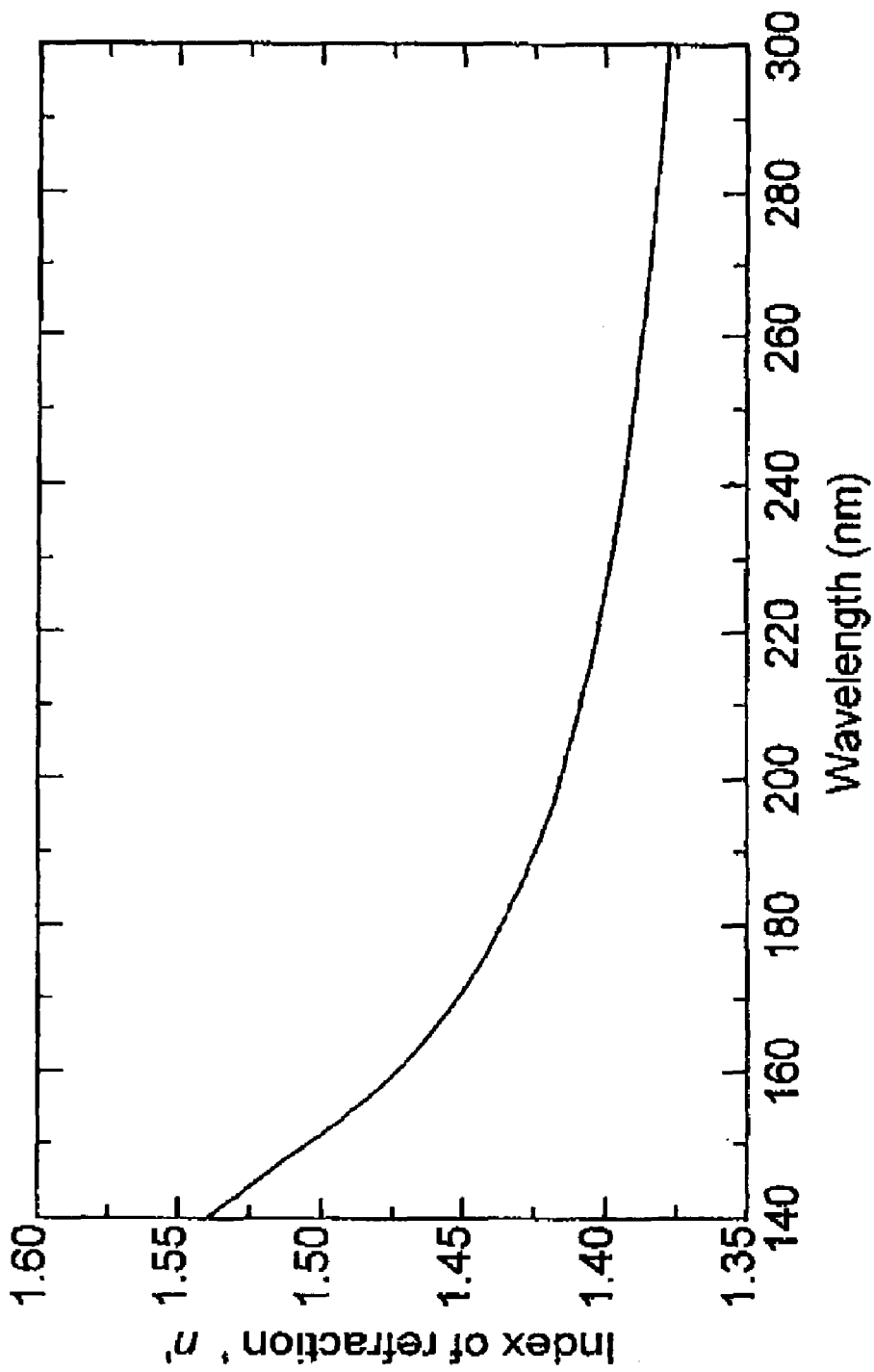
FIG. 4 describes the index of refraction (n) versus wavelength lambda (λ) in units of nanometers for the polymer of example 2 (Poly[($CH_2$=C($CF_3$)$CF_2$OCF($CF_3$)$_2$/$CH_2$=$CF_2$).

The index of refraction for Polymer 2 versus wavelength lambda (λ) in units of nanometers is shown in FIG. 4. The 157 nm index of refraction determined is 1.44. The 193 nm index of refraction determined is 1.39. The 248 nm index of refraction is 1.37.

Example 3

Poly(CF$_2$=CHOCF$_2$CF$_2$H/CH$_2$=CF$_2$) 3

A. Preparation of 1, 1,2,2-tetrafluoroethyl 2,2-difluorovinyl ether, CF$_2$=CHOCF$_2$CF$_2$CF$_2$H monomer.

a/Preparation of 1,1,2,2-Tetrafluoroethyl 2-chloro-2,2-difluoroethyl ether

A mixture of 2-chloro-2,2-difluoroethanol (22.0 g), t-butanol (45 ml), KOH (10.0 g) and TFE (25 g) was shaken at room temperature for 8 hours in a autoclave. The bottom layer of the reaction mixture was isolated and washed with water (40 ml) to give a crude product, 1,1,2,2-Tetrafluoroethyl 2-chloro-2,2-difluoroethyl ether, 29.5 g, yield 72%. This product was used for next step without further purification.

b/Preparation of 1,1,2,2-Tetrafluoroethyl 2,2-difluorovinyl ether A mixture of 1,1,2,2-Tetrafluoroethyl 2-chloro-2,2-difluoroethyl ether (29.0 g), KOH (10.0 g), and DMSO (5 ml) was heated to reflux on a spinning band distillation apparatus. The product was distilled out to give 9.6 g of 1,1,2,2-Tetrafluoroethyl 2,2-difluorovinyl ether, bp 38° C., yield 40%.

19 F NMR (CDCl3) −92.3 (s, 2 F), −92.7 (ddt, J=57, 14, 3 Hz, 1 F), −110.5 (dd, J=54, 3 Hz, 1 F), −137.4 (dt, J=52, 5 Hz, 2 F) ppm, 13 C NMR (CDCl3) 98.9 (dd, J=61, 16 Hz), 107.2 (tt, J=252, 40 Hz), 116.3 (tt, J=273, 40 Hz) 157.0 (dd, J=293, 281 Hz) ppm. 1 H NMR (CDCl3) 5.84 (tt, J=52, 3 Hz, 1 H), 6.10 (dd, J=13, 4 Hz, 1 H) ppm.

B. CF$_2$=CHOCF$_2$CF$_2$H copolymerization with CH$_2$=CF$_2$ A 75 ml stainless steel autoclave chilled to <20° C. was loaded with 9.4 g of CF$_2$=CHOCF$_2$CF$_2$H monomer, 10 ml of CF$_3$CFHCFHCF$_2$CF$_3$ solvent, and 5 ml of ~0.17 M DP in CF$_3$CFHCFHCF$_2$CF$_3$. The autoclave was chilled, evacuated and further loaded with ~4 g of vinylidene fluoride. The autoclave was shaken overnight at room temperature. The resulting hazy fluid was dried under nitrogen, then under pump vacuum, and finally for 23 hours in a 77° C. vacuum oven, giving 4.6 g of tacky gum.

Calc. for (C$_2$H$_2$F$_2$)$_3$(C$_4$H$_2$F$_6$O)$_2$: 30.45% C 1.83% H
Found: 30.65% C 1.41% H
DSC, 10° C./min, N$_2$, 2nd heat Tg@−11° C.
Inherent Viscosity, acetone, 25° C.: 0.122

C. Solution preparation

A clear, colorless solution was made by rolling 2.5 g of polymer with 10 g of 2-heptanone solvent and passing through a 0.45μ glass fiber microfiber syringe filter (Whatman Autovial™).

D. Optical characterization Spinning of solution:

The polymer solution so prepared was spin coated in a conventional atmosphere spinner at spin speeds of 1000 rpm for 60 seconds onto CaF2 and silicon substrates with a subsequent bake at 120 C for 2 minutes to produce polymer films of 900 angstroms thickness. VUV absorbance measurements were then used to determine the absorbance per micrometer and VUV ellipsometry measurements of the films on silicon were used to determine the index of refraction.

Figure 5:
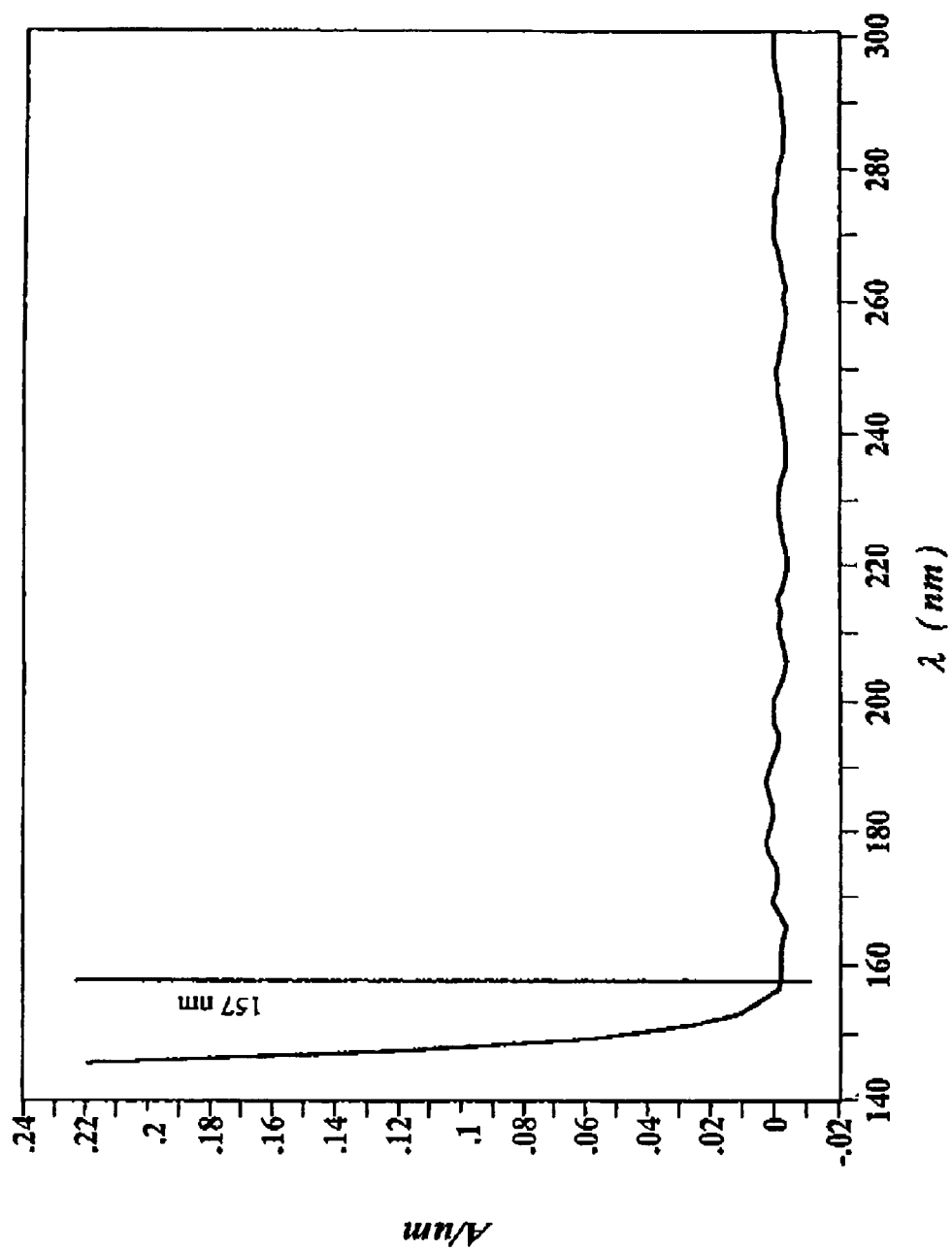
FIG. 5 describes the absorbance in units of inverse micrometers versus wavelength lambda (λ) in units of nanometers for the polymer of example 3 (Poly ($CF_2$=CHOCF$_2$CF$_2$H/$CH_2$=$CF_2$).

The absorbance in units of inverse micrometers for the polymer film so prepared versus wavelength lambda (λ) in units of nanometers is shown in FIG. 5. The 157 nm absorbance/micrometer determined was −0.002/micrometer. The 193 nm absorbance/micrometer determined was −0.001/micrometer. The 248 nm absorbance/micrometer determined was 0.003/micrometer.

Figure 6:
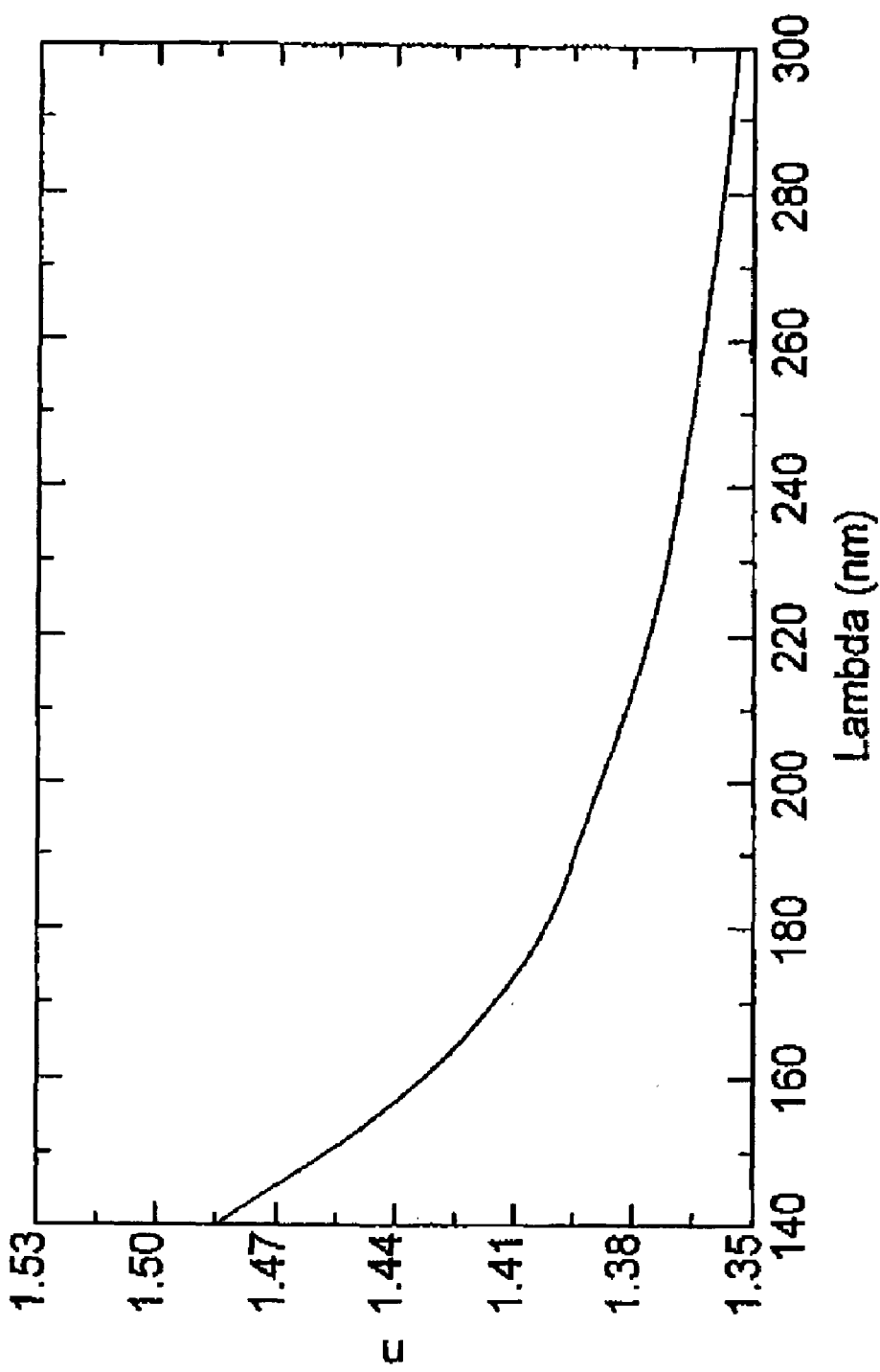
FIG. 6 describes the index of refraction (n) versus wavelength lambda (λ) in units of nanometers, for the polymer of example 3 (Poly($CF_2$=CHOCF$_2$CF$_2$H/$CH_2$=$CF_2$)).

The index of refraction versus wavelength lambda (λ) in units of nanometers was shown in FIG. 6. The 157 nm index of refraction determined was 1.48. The 193 nm index of refraction determined was 1.42. The 248 nm index of refraction was 1.39.

Example 4

Poly($CF_2$=$CHOCH_2CF_2H$/PDD) 4

A. $CF_2$=$CHOCF_2CF_2H$ copolymerization with PDD

A ~30 ml glass sample vial containing a magnetic stir bar was capped with a rubber septum, flushed with nitrogen, and chilled on dry ice. The sample vial was then injected with 5 g of $CF_2$=$CHOCF_2CF_2H$ monomer, 6.8 g of PDD monomer, and 1 ml of ~0.17 M DP in $CF_3CFHCFHCF_2CF_3$. After flushing the vial once again with nitrogen, the contents of the vial were allowed to warm slowly to room temperature with magnetic stirring. By the next morning the reaction mixture was hazy and viscous. Another 1 ml of ~0.17 M DP in $CF_3CFHCFHCF_2CF_3$ was injected and the reaction mixture stirred another 4 days at room temperature. The contents of the vial were poured into ~125 ml of hexane and the precipitate isolated by vacuum filtration giving 8.6 g of crumbly white solid.

Calc. for $(C_4F_6OH_2)_1(C_5F_8O_2)_2$: 25.17% C 0.30% H
Found: 24.97% C 0.56% H
DSC, 10° C./min, $N_2$, 2nd heat Tg@25° C.
Inherent Viscosity, hexafluorobenzene, 25° C.: 0.126

C. Solution preparation

A clear, colorless solution was made by rolling 2.5 g of polymer with 10 g of Novec™ HFE-7500 solvent and passing through a 0.45µ glass fiber microfiber syringe filter (Whatman Autovial™).

D. Optical characterization The polymer solution so prepared was spin coated in a conventional atmosphere spinner at spin speeds of 2000 rpm for the absorbance sample and 800 rpm for the ellipsometry sample for 30 seconds onto CaF2 and silicon substrates with a subsequent post apply bake at 120 C for 2 minutes to produce polymer films of 11200 angstroms thickness for VUV absorbance measurements and of 6272 angstroms thickness for VUV ellipsometry measurements. VUV absorbance measurements of the films on $CaF_2$ were then used to determine the absorbance per micrometer and VUV ellipsometry measurements of the films on silicon were used to determine the index of refraction.

The 157 nm absorbance/micrometer determined was 0.055/micrometer. The 193 nm absorbance/micrometer determined was 0.014/micrometer. The 248 nm absorbance/micrometer determined was 0.008/micrometer.

The 157 nm index of refraction determined was 1.41. The 193 nm index of refraction determined was 1.36. The 248 nm index of refraction was 1.35.

Example 5

Poly($CF_2$=$CHOCF_2CF_2CF_3$/$CH_2$=$CF_2$) 5

A. Preparation of perfluoroethyl 2,2-difluorovinyl ether, $CF_2$=$CHOCF_2CF_3$ monomer.
a) Preparation of 2-chloro-2,2-difluoroethyl trifluoroacetate.

A mixture of 2-chloro-2,2-difluoroethanol (132 g) and DMF (15 drops) was charged to a 250 ml flask. Trifluoroacetyl chloride (17 g) was introduced to the flask via a dry ice condenser at about 50° C. The resulting mixture was refluxed for 4 hours. The mixture was distilled to give 234 g of the acetate, bp 79-81° C., yield 97%. 19 F NMR (CDCl3) −62.8 (t, J=8 Hz, 2 F), −75.2 (s, 3 F) ppm, 1 H NMR (CDCl3) 4.79 (t, J=9 Hz) ppm.

b) Preparation of perfluoroethyl 2-chloro-2,2-difluoroethyl ether.

A mixture of 2-chloro-2,2-difluoroethyl trifluoroacetate (20 g), HF (150 g), and $SF_4$ (60 g) was heated to 150° C. for 21 hours. The mixture was poured into water (300 ml). The bottom layer was isolated to give crude product (16.1 g), yield 73%. It was relatively pure based on NMR analysis. Then the crude product was washed with Na2CO3 until pH=8, dried over Na2SO4, and distilled to afford the product, 11 g, bp 54-55° C., yield 50%. 19 F NMR (CDCl3) −63.5 (tt, J=9, 3 Hz, 2 F), −86.4 (s, 3 F), −91.2 (s, 2 F) ppm.

c) Preparation of Perfluoroethyl 2,2-difluorovinyl ether

A mixture of perfluoroethyl 2-chloro-2,2-difluoroethyl ether (69 g), KOH (30.0 g) and DMSO (15 ml) was heated to reflux on a spinning band distillation apparatus. The product was distilled out to give 43 g of perfluoroethyl 2,2-2,2-difluorovinyl ether, bp 15° C., yield 85%. 19 F NMR (CDCl3) −86.5 (s, 3 F), −91.8 (dd, J=18, 4 Hz, 1 F), −92.1 (s, 2 F), −109.3 (d, J=18 Hz, 1 F) ppm. 1 H NMR (CDCl3) 6.08 (dd, J=13, 4 Hz) ppm. 13 C NMR (CDCl3) 98.9 (m), (ddt, J=62, 16, 5 Hz), 116.2 (qt, J=284, 45 Hz), 114.3 (tq, J=275, 42 Hz), 156.3 (d, J 295 Hz) ppm.

B. Copolymerization of $CF_2$=$CHOCF_2CF_3$ with $CH_2$=$CF_2$

A 75 ml stainless steel autoclave chilled to <−20° C. was loaded with 10 ml of $CF_3CFHCFHCF_2CF_3$ solvent and 5 ml of ~0.17 M DP in $CF_3CFHCFHCF_2CF_3$. The autoclave was chilled, evacuated and further loaded with 10 g of $CF_2$=$CHOCF_2CF_3$ and ~4 g of vinylidene fluoride. The autoclave was shaken overnight at room temperature. The resulting fluid was dried under nitrogen, then under pump vacuum, and finally for 4 days in a 77° C. vacuum oven, giving 2.6 g of tacky gum.

Calc. for $(C_4F_7OH)_{10}(C_2H_2F_2)_{11}$: 27.74% C 1.20% H
Found: 27.89% C 0.91% H
DSC, 10° C./min, $N_2$, 2nd heat Tg@−5° C.

C. Solution preparation A solution was made by rolling 1 g of polymer with 9 g of H Galden™ ZT 85 solvent and passing through a 0.45µ PTFE fiber microfiber syringe filter (Whatman Autovial™) to remove haze.

D. Optical characterization

The polymer solution so prepared was spin coated in a conventional atmosphere spinner at spin speeds of 1000 rpm for the absorbance sample and 800 rpm for the ellipsometry sample for 30 seconds onto CaF2 and silicon substrates with a subsequent post apply bake at 120 C for 2 minutes to produce polymer films of 10200 angstroms thickness for VUV absorbance measurements and of 5880 angstroms thickness for VUV ellipsometry measurements. VUV absorbance measurements of the films on $CaF_2$ were then used to determine the absorbance per micrometer and VUV ellipsometry measurements of the films on silicon were used to determine the index of refraction.

The 157 nm absorbance/micrometer determined was 0.034/micrometer. The 193 nm absorbance/micrometer determined was 0.02/micrometer. The 248 nm absorbance/micrometer determined was 0.01/micrometer.

The 157 nm index of refraction determined was 1.47. The 193 nm index of refraction determined was 1.40. The 248 nm index of refraction was 1.38.

Example 6

Poly($CF_2$=CHOCF$_2$CF$_2$CF$_2$CF$_3$/PDD) 6

A. Preparation of perfluorobutyl 2,2-difluorovinyl ether.

$CF_2$=CHOCF$_2$CF$_2$CF$_2$CF$_3$ monomer.

a) Preparation of 2-chloro-2,2-difluoroethyl perfluorobutyrate.

A 100 ml flask was charged with 2-chloro-2,2-difluoroethanol (49 g) and DMF (10 drops). Perfluorobutyryl chloride (100 g) was added to the flask dropwise at about 50° C. The resulting mixture was heated at 50° C. for another 3 hours. The mixture gave 115 g of product, bp 128-130° C., yield 88%.

b) Preparation of perfluorobutyl 2-chloro-2,2-difluoroethyl ether. A mixture of 2-chloro-2,2-difluoroethyl perfluorobutyrate (90 g), HF (500 g), and SF$_4$ (150 g) was heated to 110° C. for 40 hours in an autoclave. Water (500 ml) was added to the reactor at 0° C. The bottom layer was isolated and dried over MgSO4, and distilled to afford the product, 71 g, bp 98° C., yield 74%, 19 F NMR (CDCl3) −63.5 (tt, J=10, 3 Hz, 2 F), −81.6 (t, J=10 Hz, 3 F), −86.2 (s, 2 F), 126.6 (m, 2 F), 127.1 (m, 2 F) ppm. 1 H NMR (CDCl3) 4.42 (t, J=10 Hz) ppm.

c) Preparation of Perfluorobutyl 2,2-difluorovinyl ether.

A mixture of perfluorobutyl 2-chloro-2,2-difluoroethyl ether (42.2 g), KOH (50.0 g) and DMSO (0.5 ml) was heated to distill the product bp <68° C. The product was redistilled to give 30.8 g of perfluorobutyl 2,2-difluorovinyl ether, bp 65° C., yield 82%. 19 F NMR (CDCl3) −81.5 (t, J=10 Hz, 3 F), −86.8 (s, 2 F), −91.0 (ddt, J=52, 13, 3 Hz, 1 F), −108.7 (dd, J=52.4 Hz, 1 F), −126.6 (m, 2 F), −127.1 (m, 2 F) ppm. 1 H NMR (CDCl3) 6.14 (dd, J=13, 4 Hz) ppm.

B. $CF_2$=CHOCF$_2$CF$_2$CF$_2$CF$_3$ copolymerization with PDD

A ~30 ml glass sample vial containing a magnetic stir bar and 5 ml of CF$_3$CFHCFHCF$_2$CF$_3$ was capped with a rubber septum, flushed with nitrogen, and chilled on dry ice. The sample vial was injected with 6 g of $CF_2$=CHOCF$_2$CF$_2$CF$_2$CF$_3$ monomer, 4.88 g of PDD monomer, and 1 ml of ~0.17 M DP in CF$_3$CFHCFHCF$_2$CF$_3$, purging the vial with nitrogen after each addition. The contents of the vial were allowed to warm slowly to room temperature with magnetic stirring. By the next morning the reaction mixture was a thick gel. The contents of the vial were poured into ~125 ml of hexane and the lumpy precipitate isolated by decantation. The wet polymer was dried by nitrogen purging, putting under pump vacuum, and finally heating for 24 hours in a 80° C. vacuum oven. This gave 6.15 g of white lumps. Fluorine NMR found 77.5 mole % PPD and 22.5 mole % $CF_2$=CHOCF$_2$CF$_2$CF$_2$CF$_3$.

DSC, 10° C./min, N$_2$, 2nd heat. Neither Tg, nor Tm detected.

C. Solution preparation

A clear, colorless solution was made by rolling 1 g of polymer with 9 g of Novec™ HFE-7500 solvent for about 5 days and passing through a 0.45μ glass fiber microfiber syringe filter (Whatman Autovial™).

D. Optical characterization The polymer solution so prepared was spin coated in a conventional atmosphere spinner at spin speeds of 2000 rpm for 30 seconds onto CaF2 and silicon substrates with a subsequent post apply bake at 120 C for 2 minutes to produce polymer films of 11700 angstroms thickness for VUV absorbance measurements and of 11492 angstroms thickness for VUV ellipsometry measurements. VUV absorbance measurements of the films on CaF$_2$ were then used to determine the absorbance per micrometer and VUV ellipsometry measurements of the films on silicon were used to determine the index of refraction.

The 157 nm absorbance/micrometer determined was 0.022/micrometer. The 193 nm absorbance/micrometer determined was 0.0015/micrometer. The 248 nm absorbance/micrometer determined was −0.001/micrometer.

The 157 nm index of refraction determined was 1.35. The 193 nm index of refraction determined was 1.30. The 248 nm index of refraction was 1.28.

Example 7

Poly($CH_2$=CFCF$_3$)7

A. Homopolymerization of 2,3,3,3-Tetrafluoropropene-1

A 75 ml autoclave chilled to <−20° C. was loaded with 10 ml of ~0.17 M DP in CF$_3$CFHCFHCF$_2$CF$_3$ solvent and 10 g of 2,3,3,3-tetrafluoropropene-1. The reaction mixture was shaken overnight. The resulting solution was evaporated down under nitrogen, then for 24 hours under pump vacuum, and finally for 45 hours in a 75° C. vacuum oven. This gave 1.77 g of polymer.

DSC, 10° C./min, N$_2$, second heat Tg@39° C.

Inherent viscosity, acetone, 25° C. 0.029 dL/g

B. Solution Preparation

A solution was made by rolling 1.17 g of polymer with 10.53 g of H Galden ZT 85 and filtering through a 0.45μ glass fiber microfiber syringe filter (Whatman Autovial™).

C. Optical Characterization

Solutions of Polymer 7 were spin coated in a conventional atmosphere spinner at spin speeds of 2000 rpm for the absorbance sample and 800 rpm for the ellipsometry sample for 30 seconds onto CaF$_2$ and silicon substrates with a subsequent post apply bake at 120 C for 2 minutes to produce polymer films of 7000 angstroms thickness for VUV absorbance measurements and of 909 angstroms thickness for VUV ellipsometry measurements. VUV absorbance measurements of the films on CaF$_2$ were then used to determine absorbance per micrometer and VUV ellipsometry measurements of the films on silicon were used to determine the index of refraction.

Optical results:

The 157 nm absorbance/micrometer determined is 0.005/micrometer. The 193 nm absorbance/micrometer determined is 0.007/micrometer. The 248 nm absorbance/micrometer determined is 0.01/micrometer.

The 157 nm index of refraction determined is 1.47. The 193 nm index of refraction determined is 1.42. The 248 nm index of refraction is 1.38.

Example 8

Poly(CH2=CFCF3/PDD) 8

A. Copolymerization of 2,3,3,3-tetrafluoropropene-1 with perfluoro-dimethyldioxole

A 75 ml autoclave chilled to <−20° C. was loaded with 5 ml of ~0.17 M DP in CF3CFHCFHCF2CF3 solvent, 12 g of perfluorodimethyldioxole, 10 ml of CF3CFHCFHCF2CF3 VertrelTM XF), and 11 g of 2,3,3,3-tetrafluoropropene-1. The reaction mixture was shaken overnight at room temperature. The resulting solution was evaporated down under nitrogen, put under pump vacuum for 3 days, and then finished by heating for 24 hours in a 75° C. vacuum oven. This gave 3.29 g of white lumps.

Calc. for (C3H2F4)5(C5F8O2)2: 28.37% C
0.95% H
Found: 28.27% C
0.99% H
Inherent viscosity, hexafluorobenzene, 25° C. 0.042

B. Solution preparation (Wheland E101100-54)

A solution was made by rolling 2.5 g of polymer with 10 g of H Galden ZT 85 and filtering through a 0.45 micron glass microfiber syringe filter (Whatman AutovialTM).

Optical characterization Spinning of solution:

Solutions of Polymer 8 were spin coated in a conventional atmosphere spinner at spin speeds of 2000 rpm for the absorbance sample and 800 rpm for the ellipsometry sample for 30 seconds onto CaF$_2$ and silicon substrates with a subsequent post apply bake at 120 C for 2 minutes to produce polymer films of 10200 angstroms thickness for VUV absorbance measurements and of 3583 angstroms thickness for VUV ellipsometry measurements. VUV absorbance measurements of the films on CaF$_2$ were then used to determine the absorbance per micrometer and VUV ellipsometry measurements of the films on silicon were used to determine the index of refraction.

Optical results:

The 157 nm absorbance/micrometer determined is 0.006/micrometer. The 193 nm absorbance/micrometer determined is 0.004/micrometer. The 248 nm absorbance/micrometer determined is −0.004/micrometer.

The 157 nm index of refraction determined is 1.46. The 193 nm index of refraction determined is 1.41. The 248 nm index of refraction is 1.38.

What is claimed is:

1. A method comprising
causing a source to emit electromagnetic radiation in the wavelength range from 150 nanometers to 260 nanometers;
disposing a target surface in the path of at least a portion of said electromagnetic radiation in such a manner that at least a portion of said target surface will be thereby illuminated; and,
interposing in the path of at least a portion of said electromagnetic radiation between said target surface and said source a shaped article comprising a fluoropolymer exhibiting an absorbance/micrometer ≦1 at wavelengths from 150 to 260 nm and a heat of fusion of <1 J/g said fluoropolymer being a homopolymer selected from group A or copolymers from groups B, C, and D wherein
group A consists of the homopolymer of $CH_2$=$CFCF_3$
group B consists of copolymers comprising >25 mole % of monomer units derived from $CF_2$=$CHOR_f$ in combination with monomer units derived from vinylidene fluoride wherein $R_f$ is a linear or branched C1 to C6 fluoroalkyl radical having the formula $C_nF_{2n-y+1}H_y$, wherein the number of hydrogens is less than or equal to the number of fluorines, no more than two adjacent carbons atoms are bonded to hydrogens, and ether oxygen can replace one or more of the carbons providing at least one of the carbons adjacent to any ether oxygen is perfluorinated;

group C consists of copolymers comprising >10 mole % of monomer units derived from $CH_2$=$CFCF_3$, $CF_2$=$CHOR_f$, or a mixture thereof in combination with monomer unit derived from 1,3-perfluorodioxoles wherein $R_f$ is a linear or branched C1 to C6 fluoroalkyl radical having the formula $C_nF_{2n-y+1}H_y$, wherein the number of hydrogens is less than or equal to the number of fluorines, no more than two adjacent carbons atoms are bonded to hydrogens, and ether oxygen can replace one or more of the carbons providing at least one of the carbons adjacent to any oxygen is perfluorinated, and wherein said 1,3-perfluorodioxole has the structure

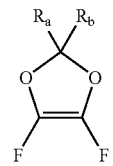

wherein $R_a$ and $R_b$ are independently F or linear —$C_nF_{2n+1}$, optionally substituted by ether oxygen, for which n=1 to 5;

group D consists of copolymers comprising 40 to 60 mole % of monomer units derived from a monomer represented by the formula

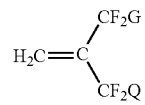

in combination with monomer units derived from vinylidene fluoride and or vinyl fluoride wherein G and Q are independently F (but not both F), H, $R_f$, or —$OR_f$ wherein $R_f$ is a linear or branched C1 to C5 fluoroalkyl radical having the formula $C_nF_{2n-y+1}H_y$, wherein the number of hydrogens is less than or equal to the number of fluorines, no more than two adjacent carbons atoms are bonded to hydrogens, and ether oxygen can replace one or more of the carbons providing that at least one of the carbons adjacent to any ether oxygen is perfluorinated.

2. The method of claim 1 wherein the shaped article is a pellicle film for use in photolithography.

3. The method of claim 1 wherein said source is a laser emitting 157 nm electromagnetic radiation.

4. The method of claim 1 wherein said target surface comprises a photopolymer.

5. The method of claim 1 wherein said shaped article is a lens and said fluoropolymer is a coating disposed upon the surface thereof.

6. The method of claim 1 wherein said fluoropolymer is a component of an adhesive composition.

7. The method of claim 1 wherein said shaped article is a lens formed from said fluoropolymer.

8. The method of claim 1 wherein the fluoropolymer is a copolymer of $CH_2\!\!=\!\!C(CF_3)CF_2OCH(CF_3)_2$ with vinylidene fluoride.

9. The method of claim 1 wherein the fluoropolymer is a copolymer of $CH_2\!\!=\!\!C(CF_3)CF_2OCF(CF_3)_2$ with vinylidene fluoride.

10. The method of claim 1 wherein the fluoropolymer is a copolymer of $CF_2\!\!=\!\!CHOCF_2CF_2H$ with vinylidene fluoride.

11. The method of claim 1 wherein the fluoropolymer is a copolymer of $CF_2\!\!=\!\!CHOCF_2CF_2H$ with 4,5-difluoro-2,2-bis(trifluoromethyl)-1,3-dioxole.

12. The method of claim 1 wherein the fluoropolymer is a copolymer of $CF_2\!\!=\!\!CHOCF_2CF_3$ with vinylidene fluoride.

13. The method of claim 1 wherein the fluoropolymer is a copolymer of $CF_2\!\!=\!\!CHOCF_2CF_2CF_2CF_3$ with 4,5-difluoro-2,2-bis(trifluoromethyl)-1,3-dioxole.

14. The method of claim 1 wherein the fluoropolymer is a homopolymer of $CH_2\!\!=\!\!CFCF_3$.

15. The method of claim 1 wherein the fluoropolymer is a copolymer of $CH_2\!\!=\!\!CFCF_3$ with 4,5-difluoro-2,2-bis(trifluoromethyl)-1,3-dioxole.

16. An apparatus comprising an activateable source of electromagnetic radiation in the wavelength range of 150-260 nanometers; and a shaped article comprising a fluoropolymer exhibiting an absorbance/micron $\leq 1$ at wavelengths from 150 to 260 nm and a heat of fusion of <1 J/g said fluoropolymer being a homopolymer selected from group A or copolymers from groups B, C, and D wherein group A consists of the homopolymer of $CH_2\!\!=\!\!CFCF_3$ group B consists of copolymers comprising >25 mole % of monomer units derived from $CF_2\!\!=\!\!CHOR_f$ in combination with monomer units derived from vinylidene fluoride wherein $R_f$ is a linear or branched C1 to C6 fluoroalkyl radical having the formula $C_nF_{2n-y+1}H_y$ wherein the number of hydrogens is less than or equal to the number of fluorines, no more than two adjacent carbons atoms are bonded to hydrogens, and ether oxygen can replace one or more of the carbons providing at least one of the carbons adjacent to any ether oxygen is perfluorinated;

group C consists of copolymers comprising >10 mole % of monomer units derived from $CH_2\!\!=\!\!CFCF_3$, $CF_2\!\!=\!\!CHOR_f$ or a mixture thereof in combination with monomer unit derived from 1,3 perfluorodioxoles wherein $R_f$ is a linear or branched C1 to C6 fluoroalkyl radical having the formula $C_nF_{2n-y+1}H_y$ wherein the number of hydrogens is less than or equal to the number of fluorines, no more than two adjacent carbons atoms are bonded to hydrogens, and ether oxygen can replace one or more of the carbons providing at least one of the carbons adjacent to any oxygen is perfluorinated, and wherein said 1,3-perfluorodioxole has the structure

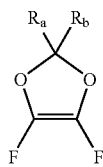

wherein $R_a$ and $R_b$ are independently F or linear $-C_nF_{2n+1}$, optionally substituted by ether oxygen, for which n=1 to 5;

group D consists of copolymers comprising 40 to 60 mole % of monomer units derived from a monomer represented by the formula

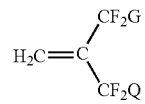

within combination with monomer units derived from vinylidene fluoride and or vinyl fluoride wherein G and Q are independently F (but no both F), H, $R_f$, or $-OR_f$ where $R_f$ is a linear or branched C1 to C5 fluoroalkyl radical having the formula $C_nF_{2n-y+1}H_y$ wherein the number of hydrogens is less than or equal to the number of fluorines, no more than two adjacent carbons atoms are bonded to hydrogens and ether oxygen can replace one or more of the carbons providing that at least one of the carbons adjacent to any ether oxygen is perfluorinated;

said shaped article being disposed to lie within the optical path of light emitted from said source when said source is activated.

17. The apparatus of claim 16 wherein said activateable light source is a laser emitting 157 nm electromagnetic radiation.

18. The apparatus of claim 16 further comprising a target surface.

19. The apparatus of claim 18 wherein said target surface comprises a photopolymer.

20. The apparatus of claim 16 wherein said shaped article is a lens and said fluoropolymer is a coating disposed upon the surface thereof.

21. The apparatus of claim 16 wherein said fluoropolymer is a component of an adhesive composition.

22. The apparatus of claim 16 wherein said shaped article is a lens formed from said fluoropolymer.

23. The apparatus of claim 16 wherein the shaped article is a pellicle film for use in photolithography.

24. The apparatus of claim 16 wherein the fluoropolymer is a copolymer of $CH_2\!\!=\!\!C(CF_3)CF_2OCH(CF_3)_2$ with vinylidene fluoride.

25. The apparatus of claim 16 wherein the fluoropolymer is a copolymer of $CH_2\!\!=\!\!C(CF_3)CF_2OCF(CF_3)_2$ with vinylidene fluoride.

26. The apparatus of claim 16 wherein the fluoropolymer is a copolymer of $CF_2\!\!=\!\!CHOCF_2CF_2H$ with vinylidene fluoride.

27. The apparatus of claim 16 wherein the fluoropolymer is a copolymer of $CF_2\!\!=\!\!CHOCF_2CF_2H$ with 4,5-difluoro-2,2-bis(trifluoromethyl)-1,3-dioxole.

28. The apparatus of claim 16 wherein the fluoropolymer is a copolymer of $CF_2\!\!=\!\!CHOCF_2CF_3$ with vinylidene fluoride.

29. The apparatus of claim 16 wherein the fluoropolymer is a copolymer of $CF_2\!\!=\!\!CHOCF_2CF_2CF_2CF_3$ with 4,5-difluoro-2,2-bis(trifluoromethyl)-1,3-dioxole.

30. The apparatus of claim 16 wherein the fluoropolymer is a homopolymer of $CH_2\!\!=\!\!CFCF_3$.

31. The apparatus of claim 16 wherein the fluoropolymer is a copolymer of $CH_2\!\!=\!\!CFCF_3$ with 4,5-difluoro-2,2-bis(trifluoromethyl)-1,3-dioxole.

* * * * *